United States Patent [19]
Gotou et al.

[11] Patent Number: 5,623,442
[45] Date of Patent: Apr. 22, 1997

[54] MEMORY CELLS AND MEMORY DEVICES WITH A STORAGE CAPACITOR OF PARASITIC CAPACITANCE AND INFORMATION STORING METHOD USING THE SAME

[75] Inventors: Hiroshi Gotou; Mamoru Kondo; Hirofumi Abe, all of Tokyo, Japan

[73] Assignee: NKK Corporation, Tokyo, Japan

[21] Appl. No.: 379,480

[22] PCT Filed: Jun. 8, 1994

[86] PCT No.: PCT/JP94/00928

§ 371 Date: Jan. 31, 1995

§ 102(e) Date: Jan. 31, 1995

[87] PCT Pub. No.: WO95/02884

PCT Pub. Date: Jan. 26, 1995

[30] Foreign Application Priority Data

Jul. 13, 1993 [JP] Japan ................................. 5-172956
May 17, 1994 [JP] Japan ................................. 6-102717

[51] Int. Cl.⁶ ................................................ G11C 11/40
[52] U.S. Cl. ............... 365/185.08; 365/149; 365/185.29; 365/185.01
[58] Field of Search ............................ 365/185.08, 149, 365/185.29, 182, 187, 185.01

[56] References Cited

U.S. PATENT DOCUMENTS

| | | |
|---|---|---|
| 4,282,446 | 8/1981 | McElroy . |
| 4,725,983 | 2/1988 | Terada ................................. 365/104 |
| 4,797,856 | 1/1989 | Lee et al. . |
| 5,075,888 | 12/1991 | Yamauchi et al. ................. 365/185.08 |
| 5,126,808 | 6/1992 | Montalvo et al. . |
| 5,126,969 | 6/1992 | Kawana ............................ 365/185.08 |
| 5,132,935 | 7/1992 | Ashmore, Jr. . |
| 5,327,385 | 7/1994 | Oyama . |
| 5,402,373 | 3/1995 | Aritome et al. . |
| 5,406,521 | 4/1995 | Hara . |

FOREIGN PATENT DOCUMENTS

| | | |
|---|---|---|
| 0108681 | 5/1984 | European Pat. Off. . |
| 53-46621 | 12/1978 | Japan . |
| 62-266793 | 11/1987 | Japan . |
| 2-166764 | 6/1990 | Japan . |
| 4-105368 | 4/1992 | Japan . |
| 5-189988 | 7/1993 | Japan . |

OTHER PUBLICATIONS

Patent Abstracts of Japan, vol. 16, No. 445 (P–1422), Japanese Publication No. JP 4155694 published May 28, 1992.

(List continued on next page.)

*Primary Examiner*—David C. Nelms
*Assistant Examiner*—Vu A. Le
*Attorney, Agent, or Firm*—Burns, Doane, Swecker & Mathis, LLP

[57] ABSTRACT

An object of the present invention is to provide a DRAM of a special form, a non-volatile memory cell incorporating the DRAM, and a semiconductor device which incorporates a DRAM structure and a non-volatile memory cell and where data can be written and erased with high accuracy. The semiconductor memory device has a sub bit line BLs1 to which the main bit line BL1 is connected via a selector transistor Tr1, and non-volatile memory cells M1-Nn, i.e., memory transistors whose drain electrodes are connected to the sub bit line Bls1. An a–c pulse generator applies an a–c voltage to the control gates of the non-volatile memory cells M1-Nn. The DRAM cell is formed of a capacitor element formed of parasitic capacitance of the sub bit line BLs1 and the drain electrodes of the non-volatile memory cells connected to the bit line BLs1. An arbitrary non-volatile memory cell Mk is connected with the memory node N of a DRAM cell, thereby implementing a non-volatile memory cell or non-volatile memory device having DRAM functions. The DRAM cells may operate independently of the non-volatile memory cells. Data is temporarily stored in the DRAM cell and is then transferred to the non-volatile memory cell Mk, thereby writing and erasing data with high accuracy at higher speeds, and allowing miniaturization of a memory device.

27 Claims, 12 Drawing Sheets

OTHER PUBLICATIONS

M. Lanzoni et al., "A Novel Approach to Controlled Programming of Tunnel–Based Floating–Gate MOSFET's," *IEEE Journal of Solid–State Circuits*, vol. 29, No. 2, Feb. 1994, pp. 147–150.

J. Kupec et al., "Triple Level Poly Silicon E²Prom With Single Transistor Per Bit," International Electron Devices Meeting, Dec. 8, 1980, Washington, D.C., pp. 602–606.

S. Yamada et al., "A Self–Convergence Erasing Scheme For A Simple Stacked Gate Flash EEPROM," *IEDM Tech Dig.,* Dec. 1991, pp. 307–310.

V.N. Kynett et al., "An In–System Reprogrammable 32K×8 CMOS Flash Memory," *IEEE J. Solid–State Circuits,* vol. 23, No. 5, Oct. 1988, pp. 1157–1162.

S. Yamada et al., "A Self–Convergence Erasing Scheme For A Simple Stacked Gate Flash EEPROM," *IEEE Journal of Solid–State Circuits,* vol. 29, No. 2, Feb. 1994, pp. 307–310.

FIG. 1A
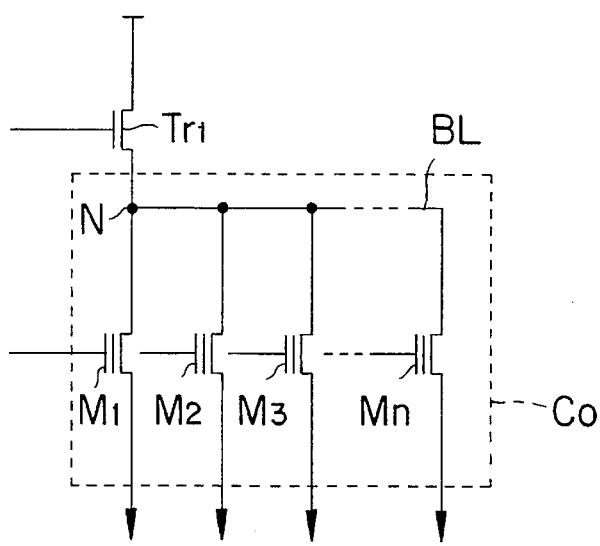
FIG. 1B
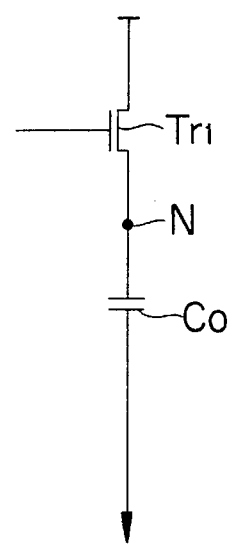
FIG. 1C
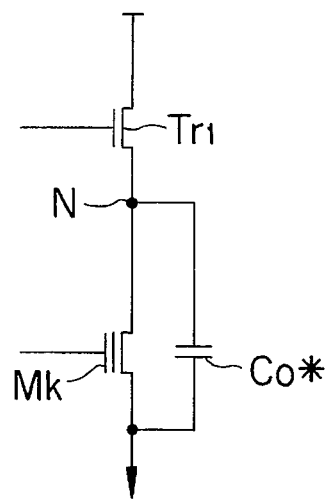
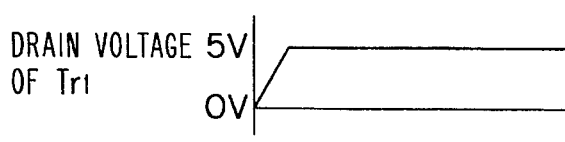
FIG. 1D(1)
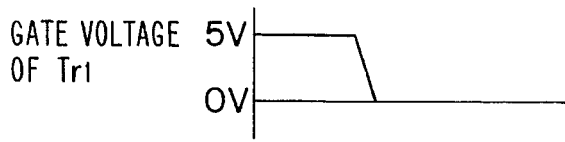
FIG. 1D(2)
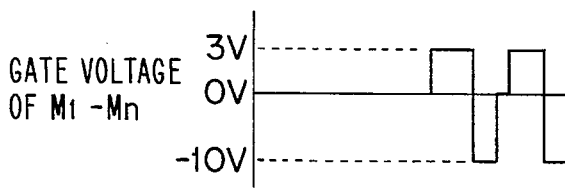
FIG. 1D(3)

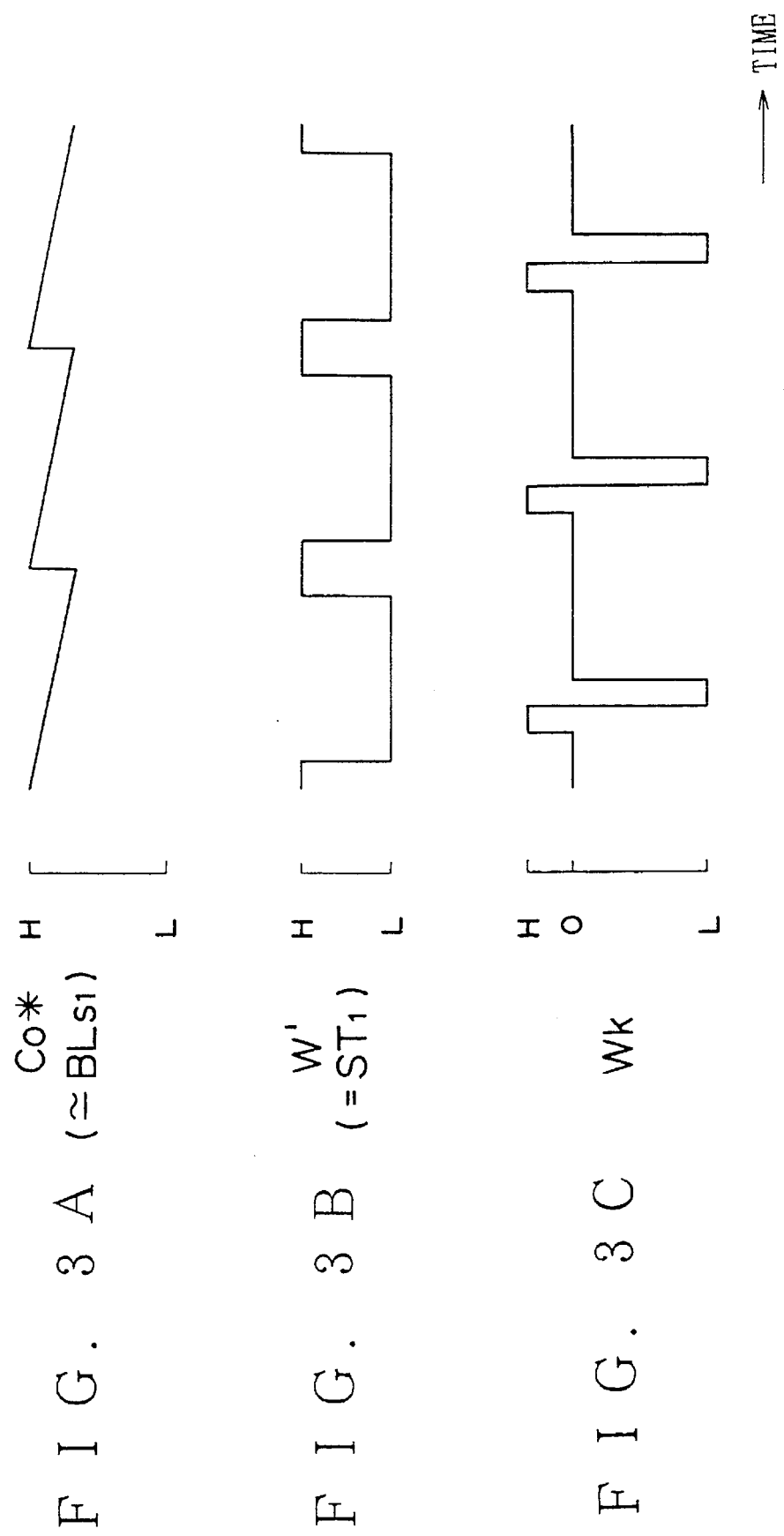

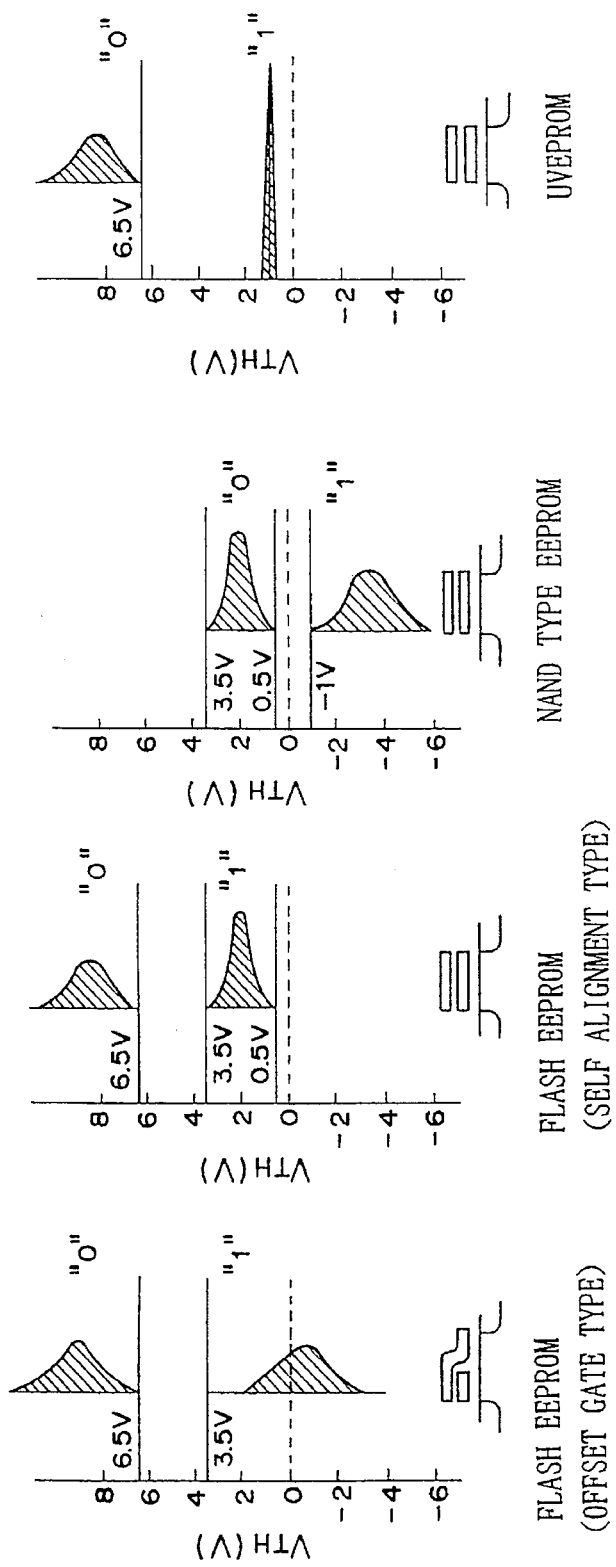

MEMORY CELLS AND MEMORY DEVICES WITH A STORAGE CAPACITOR OF PARASITIC CAPACITANCE AND INFORMATION STORING METHOD USING THE SAME

FIELD OF THE INVENTION

The present invention relates to a memory cell and memory device with a storage capacitor of parasitic capacitance and a method of storing information therein. The non-volatile memory device incorporates write and erase functions based on a DRAM where parasitic capacitance associated with bit lines and surrounding circuits are conveniently used.

PRIOR ART

Hot electron and tunnel current are used to extract electron from and to inject electrons into the floating gate of a floating gate type non-volatile memory device such as EEPROMS (electrically erasable programmable read only memories) and UVEPROMS (ultraviolet erasable programmable read only memories). Such a non-volatile memory device inherently requires a relatively long time to erase data therefrom and to write data therein as opposed to DRAMs and SRAMs, Unless otherwise indicated, extraction of electrons from a floating gate refers to write operation and injection of electrons into a floating gate refers to erasure operation in the present invention.

Various methods of overcoming the above-mentioned drawbacks have been proposed. One such method is to provide a buffer memory based on SRAM and DRAM outside of a floating gate type non-volatile memory device. As shown in FIG. 10, This method makes it possible to temporarily storage of data from a CPU 20 into a buffer memory (RAM) 21 and to subsequently write the data into a floating gate type non-volatile semiconductor device (EEPROM) 22 at relatively slow speeds, thereby implementing shorter overall write time.

The write and erase operations of conventional floating gate type non-volatile memory devices are performed either in a method where hot electron is used to write data and tunnel current is used to erase the data, or in a method where tunnel current is used both to write and erase data. The former- method is typically used in so-called flash EEPROMs where data is erased at a time. The latter method is typically used in NAND type EEPROMs. A third method is used in UVEPROMs where hot electron is used to write data and ultraviolet rays are used to erase the data.

FIGS. 11A–11D illustrate distributions of threshold voltage of memory cells or transistors (referred to as memory transistor hereinafter) constituting the memory cells, plotting threshold voltage $V_{TH}$ as ordinate and frequency of occurrence of threshold voltage $V_{TH}$ as abscissa. FIGS. 11A–11D show flash type EEPROMs A and B, a NAND type EEPROM C, and a UVPROM D, respectively.

In the figures, logic "0" indicates a condition where a memory transistor's threshold voltage is high due to the accumulation of charge on the floating gate of the memory transistor so that little or no drain current flows through the memory transistor, i.e., data has been written hereinto. Logic "1" represents a condition where a memory transistor's threshold voltage is low due to the extraction of charge from the floating gate of the memory transistor so that some drain current flows or drain current is prone to flow, i.e., data has been erased therefrom.

As is clear from FIGS. 11A–11D, threshold voltages before write operation and after erasure operation, except the erasure of the UVEPROM, are widely distributed in any methods mentioned above. Hot electron and tunnel current are greatly affected by channel length, channel width, film thickness and uniformity of tunnel insulator film, drain voltage, and control gate voltage whose variations causes variations of threshold voltage of memory transistors.

Thus, the conventional semiconductor non-volatile memory devices need to be improved in terms of the distribution of threshold voltage in order to improve reliability of write and erase operations. One typical way of overcoming the deficiency is to provide a special logic circuit within the device to urge threshold voltages to converge within a desired range (K. N. Kynette et al., "An In-System Reprogrammable 32k×8 CMOS flash Memory, IEEE J. Solid-State Circuits," Vol. 23, No. 5 pp595–598, December 1992.) This method includes two operations; a write operation where charges are stored on the floating gate to set the transistor to data "0" and a read operation or verify operation where each memory cell is checked determine whether or not data "0" has been written thereinto. These two operations are repeated alternately with each other. After all the memory cells have been written data "0". After writing data "0" into all the memory cells ass the data are erased at a time to set all the memory cells to data "1". That is, a write operation is performed prior to an erasure operation, preventing excessive erasure of memory cells.

FIG. 12 illustrates an apparatus in which the erasure of non-volatile memory cells is self-controlled, disclosed in Japanese Patent Preliminary Publication No. 64-46297 (granted to Winston K. M. Lee, Intel Corporation). FIGS. 12A and 12B illustrate a technique where an ultimate potential of a floating gate, i.e., the threshold voltage of a memory transistor is adjusted to a desired value or within a predetermined range by providing a special feedback amplifier 13 and a comparator 15 between the drain D and the control the date 11 of a non-volatile memory cell 10 to control erasure voltage.

Another method has been proposed where hot holes are injected into the floating gates of memory transistors having large variations of threshold voltage, so that the threshold voltages are distributed in a narrower range (S. Yamada et el. "A Self-Convergence Erasing Scheme for a Simple Stacked Gate Flash EEPROM", IEDM Tech. Dig., pp.307–310, December 1991.)

The aforementioned prior art suffers from the following drawbacks.

Providing a buffer memory outside of a non-volatile memory device results in larger overall size and complexity of the memory device. Providing a logic circuit and a feedback circuit results in larger circuit configuration. Moreover, a write operation and a verify operation are repeated alternately until erasure has been completed. This is a time consuming operation. Injecting hot holes into the floating gates is a time consuming operation since hot hole current is very small, e.g., $10^{-5}$ times as small as tunnel and electron current.

An object of the present invention is to provide a memory cell of special DRAM configuration and a memory device formed by combining memory cells of such DRAM configuration and floating gate type non-volatile memory cells. Another object of the invention is to provide a memory device and a storage method thereof, which memory device is of small size and simple construction and has a short write time. Still another object of the invention is to provide a simple, general purpose memory device and a storage method thereof where the aforementioned essential part, i.e., the special DRAM configuration is used and the variation of threshold voltage of memory cells are reduced, thereby greatly reducing erasure time.

MEANS FOR SOLVING THE SUBJECT

A non-volatile memory according to the present invention is a non-volatile memory which includes a storage element constructed of a transistor and a capacitor element formed of parasitic capacitance associated with a wire or wires coupled to transistor and portions electrically connected with the wire or wires. A memory cell according to the invention includes a first storage element constructed of a transistor and a capacitor, and a second storage element having a control gate and a floating gate and being electrically connected to the storage node of the first storage element. The capacitor of the first storage element is preferably parasitic capacitance associated with the wires of the first storage element and portions electrically connected with the wires.

A first memory device is provided with a non-volatile memory cell constructed of a transistor having a control gate and a floating gate, a bit line to which the non-volatile memory is connected, and a capacitor element formed of parasitic capacitance associated with the bit line and portions electrically connected to the bit line, and a selector switch element for selecting the bit line. The first device is preferably provided with a means for applying an a–c voltage having positive and negative swings to a non-volatile memory cell, i.e., the control gate of a transistor constituting the non-volatile memory. This a–c voltage is preferably applied to the control gate of a non-volatile memory cell having an early threshold voltage higher than 4 volts. The positive peak value of this a–c voltage is preferably smaller than the early threshold of a memory cell, or the negative peak value of the a–c voltage is preferably less than −10 volts.

This memory device may be so constructed so that sub bit Nines may be connected via a selector switch to a main bit line. The capacitor element stores charges therein to temporarily store data or information. An additional capacitor may be connected to the bit line in parallel with a non-volatile memory cell so that the additional capacitor is in parallel with the capacitor of parasitic capacitance.

A second device according to the invention is provided with a main bit line, a non-volatile memory cell constructed of a transistor having a control gate and a floating gate, a sub bit line to which the non-volatile memory cell is connected, a selector switch element for connecting the main bit line with the sub bit line, a capacitor element resulted from parasitic capacitance associated with the sub bit line and portions connected to the sub bit line, and a transfer means for transferring the data stored on the capacitor element to the associated non-volatile memory cell.

The second device may be provided with a control means. This control means performs activation of a refreshing means that holds the data stored on the capacitor element, or activation of the refreshing means alternately with the transfer means.

In order to accomplish the aforementioned objects, a first storage method uses a memory device having a bit line. Data is temporarily stored in a storage element constructed of resultant parasitic capacitance associated with a bit line and portions electrically connected to the bit line.

A second storage method uses a memory cell constructed of a transistor having a control gate and a floating gate, and a bit line to which the non-volatile memory cell is connected. The bit line is first set to a positive potential and data is subsequently written on a capacitor element constructed of parasitic capacitance associated with the bit line and portions connected thereto. Then, the potential of the control gate is changed to transfer the data to the non-volatile memory cell.

A third storage method uses a memory device having a bit line to which a non-volatile memory cell with a control gate and a floating gate is connected. An a–c voltage having positive and negative swings is applied to the control gate of the non-volatile memory cell so that the data is erased data temporarily stored on a capacitor element constructed of parasitic capacitance of the bit line and portions electrically connected to the bit line.

A fourth storage method uses a memory cell constructed of a transistor having a control gate and a floating gate, a bit line to which a non-volatile memory cell is connected, and a selector switch element for selecting the bit line. Information or data is stored on a capacitor element constructed of a parasitic capacitances of the bit line and at least one portion electrically connected to the bit line, Refreshing the information is performed alternately with transferring the information to the non-volatile memory cell in such a way that the refreshing period does not overlap the transferring period.

OPERATION

A storage element of the invention offers a new DRAM type memory element based on a resultant parasitic capacitance associated with wires and portions electrically connected to the wires, A memory cell of the invention offers a new type of memory by combining two different memory elements, i.e., a DRAM type memory element and a floating gate type memory cell. This memory cell is characterized in that parasitic capacitance associated with wires and portions electrically connected to the wires serves as a capacitor element of a DRAM type memory element. As in the first data storage method, the memory cell also performs functions similar to those of a DRAM where data is stored on the capacitor element.

The first memory device of the invention provides a new memory device, which includes a memory cell implemented by combining a floating gate type non-volatile memory cell and a DRAM type memory element based on parasitic capacitance associated with a bit line and portions electrically connected to the bit line. This construction provides a non-volatile memory with functions of a DRAM.

In the first memory device, the capacitor element constituting a DRAM type memory element is connected to the drain electrode of a memory transistor having a floating gate type non-volatile memory cell, setting a drain potential. To make full use of this feature, a novel means for aligning the threshold value of a floating gate type non-volatile memory cell is added for high operating performances. A capacitor may be added to the non-volatile memory device so as to supply deficiency of parasitic capacitance associated with the bit line and portions electrically connected to the bit line.

The second memory device is provided with a DRAM type memory element based on parasitic capacitance associated with a bit line and portions electrically connected to the bit line, a floating gate type non-volatile memory cell, and a data transfer means for transferring from a DRAM type memory element to a floating gate type non-volatile memory cell. This construction corresponds to the second information storage method. A buffer memory may be incorporated within the memory device so as to write data into the floating gate type non-volatile memory cell.

Adding a refreshing means and a control means which activates a data transfer means of the DRAM type memory element alternately with the refreshing means to the memory device, allows to prevent the stored data from being degraded due to the leakage of charge from the parasitic capacitance of the DRAM type memory element, and also allows to prevent the drain voltage of the non-volatile memory cell from decreasing due to the leakage of charge from the non-volatile memory cell.

With the second memory device, activating the data transfer means alternately with the refreshing means allows the data to be refreshed during the data transferring period so that the drain potential of the floating gate type non-volatile memory cell is held constant, thereby substantially eliminating adverse effects due to leakage of charge. This advantage is the same as that of the fourth information storage method. In the fourth method, refreshing operation is performed alternately with data-transferring operation with the refreshing period not overlapped with the data-transferring period, thereby preventing failure of data-transferring operation due to the abnormal decrease in threshold of the non-volatile memory cell.

In the third information storage method, the data stored on a floating gate type non-volatile memory cell may be erased by aligning the threshold of the floating gate type non-volatile memory cell. The threshold voltage of the floating gate type non-volatile memory cell is decreased to turn on the memory transistor so that channel current flows to discharge the charges stored on the capacitor element connected to the drain electrode, thereby erasing the data stored on the capacitor element.

BRIEF DESCRIPTION OF THE DRAWINGS

FIG. 1A illustrates an electrical circuit showing a first embodiment of a memory cell of the invention, FIG. 1B is an equivalent circuit of a principal circuit, FIG. 1C shows another equivalent circuit of the principal circuit in FIG. 1A, and FIG. 1D shows waveforms of the respective nodes in FIG. 1A;

FIG. 3A shows waveforms of the voltage on the sub bit line, FIG. 3B shows waveforms of the voltage applied to the word line W', and FIG. 3C shows pulse waveforms applied to the control gate of a non-volatile memory cell;

FIG. 44 is a block diagram showing third embodiment of a memory device of the invention.

FIG. 8 shows a relation between early thresholds of non-volatile memory cells and thresholds after alignment;

FIGS. 11A and 1B show a frequency of occurrence of threshold voltage of a flash type EEPROM, FIG. 11C shows a frequency of occurrence of threshold voltages of a NAND type EEPROM, and FIG. 11D Shows a frequency of occurrence of threshold voltage of a UVEPROM.

EXAMPLES

Figure 2A:
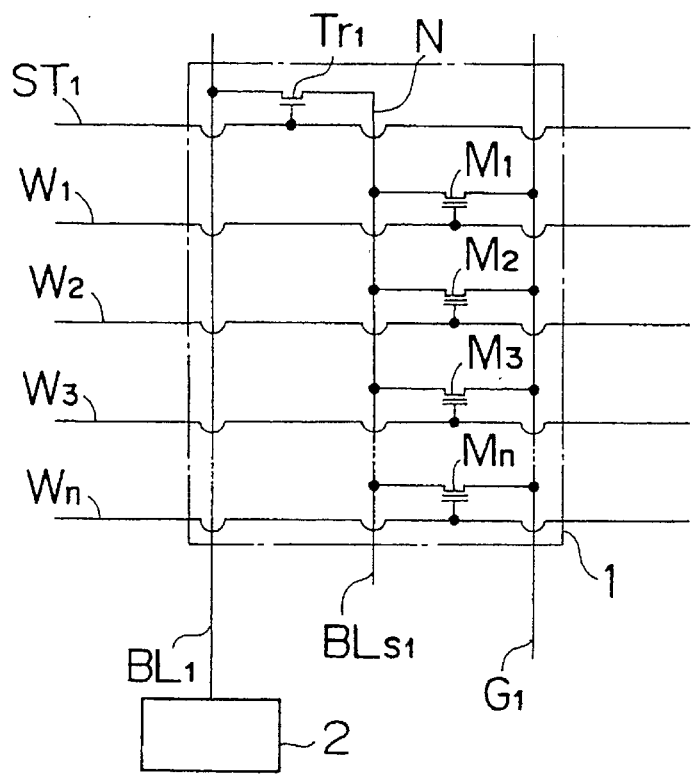
FIG. 2A is a schematic diagram showing a second embodiment of a memory cell of the invention.
Figure 2C:
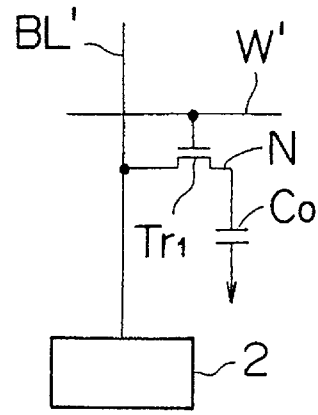
FIG. 2C shows another equivalent circuit of the basic unit in FIG. 2A.

A memory element, a non-volatile memory, and a non-volatile memory device of the invention will be described by way of example of a DRAM type storage element and a non-volatile memory where a DRAM type storage element is combined with a floating gate type non-volatile memory cell (referred to as combination type non-volatile memory). Further, the information storage method of the invention will also be described by way of example of a method of aligning threshold voltage of a non-volatile memory cell.

FIG. 1 is a schematic diagram, showing the principal part of an embodiment of a memory cell of the invention and illustrating a DRAM type memory element and a combination type non-volatile memory.

In FIG. 1A, M1-Mn denote non-volatile memory cells each having at least one memory transistor. Tr1 denotes a selector switch for selecting a bit line BL. There are as many selector switches as there are bit lines. The selector switch Tr1 takes the form of a selector transistor formed of a MOS transistor. M1-Mn are typically non-volatile memory cells each of which having a control gate and a floating gate and can be electrically written data therein and electrically erased therefrom. An arbitrary memory cell Mk where k=1, 2, 3 . . . , n, is connected at a storage node N in series with the selector switch element Tr1 via a bit BL. At least one non-volatile memory cell is connected to the bit line BL. A plurality of non-volatile memory cells are in parallel with each other and connected to a common bit line.

Co denotes a capacitor form of parasitic capacitance associated with the bit line BL and portions electrically connected to the bit line BL, and Co* denotes primarily or approximately a capacitor formed of parasitic capacitance of the bit line BL. The portions electrically connected to the bit line BL include the selector switch Tr1 and non-volatile memory cells M1-Mn, Some circuit configurations may allow the use of other transistors and routing of wires. The selector switch Tr1 and non-volatile memory cells M1-Mn each have at least one transistor. The impurity diffusion layer on the side when such transistor is connected to the bit line BL, primarily contributes to capacitors Co and Co*.

Of course, the longer the bit line BL, the larger becomes the parasitic capacitance associated with the bit line BL. The more number of the non-volatile memory cells M1-Mn electrically connected to the bit line BL, the larger becomes the parasitic capacitance associated with the non-volatile memory cells M1-Mn. Many more non-volatile memory cells necessitate longer bit line BL, thereby resulting in large capacitors of parasitic capacitance Co and Co*.

A shorter bit line BL sometimes fails to result in sufficiently large capacitors of parasitic capacitance Co and Co*, in which case an additional capacitor may be added to the bit line BL to increase a total value of Co or Co*. The additional capacitor can be electrically connected to the bit line BL in parallel with the non-volatile memory cells M1-Mn.

FIGS. 1B–1C show equivalent circuits of FIG. 1A. As is clean from FIG. 1B, the circuit in FIG. 1A is equivalent to a DRAM cell having a capacitor element of parasitic capacitance Co, i.e., a memory cell when a memory node N is at the junction of the selector switch Tr1 and the capacitor element Co in series with the selector switch element Tr1. Thus, a non-volatile memory device according to the present invention provides inherent functions of non-volatile memory cell M1-Mn and functions of a DRAM cell having the equivalent circuit shown in FIG. 1B. The circuit in FIG. 18 operates as a DRAM cell independently of the non-volatile memory device.

Known technologies of a DRAM may be directly applied to the non-volatile memory device with respect to functions of the DRAM cell. For example, the selector switch element Tr1 is turned on so as to charge the capacitor element Co to set the memory node N to a high potential, thereby writing data. Also the selector switch element Tr1 is turned on to discharge the capacitor element Co through the selector switch element Tr1 to set the memory node N to a low potential, thereby erasing data. Data is read out by detecting the potential on the memory node N. If data cannot be held for a long time due to leakage of charge from the capacitor element Co, the data may be refreshed through the use of known techniques in the DRAM technology, i.e., the same data can be written again.

The circuit in FIG. 1A is in fact a memory element constructed of a selector transistor Tr1 and the parasitic capacitance which serves as a capacitor element Co* as shown in FIG. 1C. A floating gate non-volatile memory cell Mk is connected in parallel with the capacitor element Co* to form a novel non-volatile memory, i.e., combination type non-volatile memory cell having a memory node N at the junction of the capacitor element Co* and the memory cell This cell operates in a special manner since the operations of a DRAM and a floating gate type non-volatile memory cell are combined together. That is, when writing data, the data is temporarily stored on the DRAM cell and is then transferred to the floating gate type non-volatile memory cell and vice versa.

An embodiment of a method of aligning the threshold values of non-volatile memory cells will now be described. A method of aligning threshold values of non-volatile memory cells M1-Mn of a non-volatile memory device in FIG. 1A, is described with reference to the time chart in FIGS. 1D(1)–(3). This method is a method where an a–c voltage having positive and negative swings or an a–c pulse signal is applied to the control gate of respective non-volatile memory cells to align threshold values of the non-volatile memory cells.

The following description assumes that the drain electrode of the memory transistor is connected to the memory node N (see FIG. 1C). The source electrode of the memory transistor may sometimes be connected to the memory node N, and therefore the following description is only exemplary.

Depending on memory construction and the manner in which a voltage is applied (i.e., electric field distribution), a tunnel current may flow between the floating gate and the channel.

The selector transistor Tr1 is first turned on so as to hold the drain electrode of the memory transistor Mk at higher potential than the source electrode thereof. This is done as follows: The parasitic capacitance associated with the drain electrode and the bit line, which serves as Co*, is charged up. An additional capacitor may be connected to the drain electrode of the memory transistor Mk and the additional capacitor is also charged up. Then, an a–c pulse signal having positive and negative swings is applied to the control gate of the memory transistor Mk. Upon applying a positive voltage, the memory transistor Mk is turned on if it has a threshold value lower than a predetermined lower limit, so that charges move from the drain electrode of the memory transistor Mk to the source electrode with the result that tunnel current will not flow even if a negative voltage is applied to the control gate once the drain voltage has been decreased sufficiently. In other words, no further electron is extracted from the floating gate so that the threshold of the memory transistor will not change afterward.

Upon applying a negative voltage, the charges stored on the floating gate of the transistor Mk are extracted to the drain electrode, so that the threshold voltage of the memory transistor Mk decreases by that amount. Upon applying a positive voltage to the control gate, the memory transistor Mk is turned on if it comes to have a threshold lower than the predetermined lower limit, so that charges move from the drain electrode of the memory transistor MK to the source electrode with the result that electron will not be extracted from the floating gate even if a negative voltage is applied to the control gate once the drain voltage has been decreased sufficiently. Thereafter, no change in threshold of the memory transistor occurs. Repeating the aforementioned steps will urge the distribution of threshold of all the non-volatile memory cells to converge into a narrow range. The degree of convergence of threshold depends on the number of times that the above steps are repeated and the thresholds within a predetermined range are often sufficient in many applications.

The waveform of the a–c pulse signal applied to the control gate of the non-volatile may be of any shape such as rectangle, sinusoid, and triangle.

The method of aligning threshold voltages will be described in more detail as follows:

For example, ten pulses of an a–c pulse signal having swings between +3 to −10 volts are applied to the control gate of the non-volatile memory cell (transistor) Mk.

The drain voltage of the selector transistor Tr1 is first set to 5 volts and the gate voltage to 5 volts so that the selector transistor Tr1 is turned on, Then, the parasitic capacitance of the bit line BL and portions electrically connected to the bit line BL, which serve as Co or Co*, is charged. Charging the capacitor formed of parasitic capacitance causes an increase in the drain voltage of the memory transistor Mk. Then, the above-mentioned a–c pulse signal is applied to the control gate of the memory transistor Mk with the selector transistor Tr1 turned off (gate voltage=0 volt). Applying a +3-volt pulse to the control gate of the memory transistor Mk causes the memory transistor Mk to turn on if it has a threshold less than a predetermined value, so that channel current flows from the drain electrode to the source electrode. The drain voltage of the memory transistor decreases since the charges on the capacitor element are discharged. Thus, tunnel current will not flow through the memory transistor even if a negative voltage is applied to the control gate thereafter.

Upon applying a negative voltage of −10 volts to the control gate of the memory transistor, the potential of the floating gate becomes negative, typically half that of the control gate. This causes some amount of electron to be extracted from the floating gate to the drain electrode, so that the corresponding tunnel current flows between the floating gate and the drain electrode. Subsequently applying a positive voltage of 3 volts to the control gate of the memory transistor causes the memory transistor to turn on if the memory transistor comes to have a threshold below a predetermined value with the result that the drain voltage of the memory transistor decreases due to extraction of the charge stored on the capacitor element. Thereafter, the a–c pulse signal is repeatedly applied so that the thresholds of all the non-volatile memory cells ultimately converge to a target value.

Figure 7:
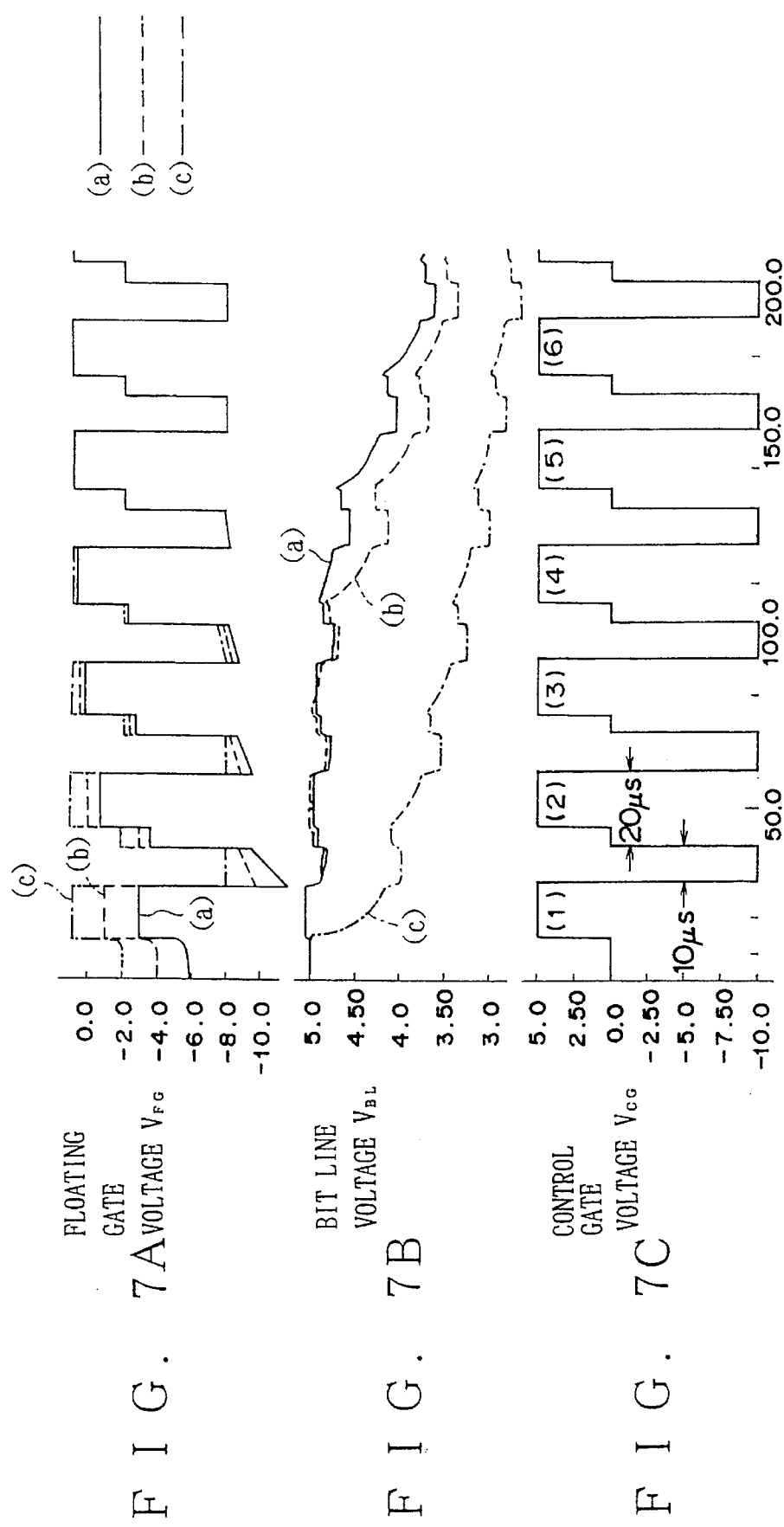
FIGS. 7A-7C are waveform diagrams showing the changes in threshold voltage of a non-volatile memory cell.

FIG. 7C shows a control gate voltage $V_{CG}$ (1), (2) . . . , (6) including a plurality of pulses that swing between 5 volts and −10 volts. FIGS. 7A and 7B illustrate changes in floating gate potential $V_{FG}$ with time and changes in bit line voltage $V_{BL}$ with time, respectively, when the voltage $V_{CG}$ in FIG. 7C is applied to the control gate of a floating gate type memory transistor.

As depicted by voltages (a), (b), and (c) in FIG. 7A, early values of −6V, −4V, −2V of the floating gate voltage $V_{FG}$ converge to a predetermined potential of about −2 volts in about 100 μs. Since the threshold of a memory cell is about twice the absolute value of the floating gate potential $V_{FG}$, it turns out that early threshold voltages of 12V, 8V, 4V have converged to about 4V after applying an a–c voltage to the control gate.

As depicted by curves (a), (b), and (c) in FIG. 7B, memory cells having low threshold values lose their bit line potentials $V_{BL}$ rather rapidly and the voltages $V_{BL}$ decrease asymptotically to certain values as soon as the first pulse is applied. On the other hand, memory cells having high threshold values do not rapidly lose their bit line potentials $V_{BL}$ until a fourth pulse (curve (4) in FIG. 7C) is applied. The higher the threshold value, the longer the time before the bit line potential $V_{BL}$ decreases. However, it is to be noted that the threshold values converge asymptotically to a certain bit line potential $V_{BL}$ irrespective of the early value of threshold. Thus, it turns out from FIGS. 7A–7C that applying an a–c voltage to the control gate of a floating gate type memory transistor allows to align the threshold value of the memory cell.

Figure 8:
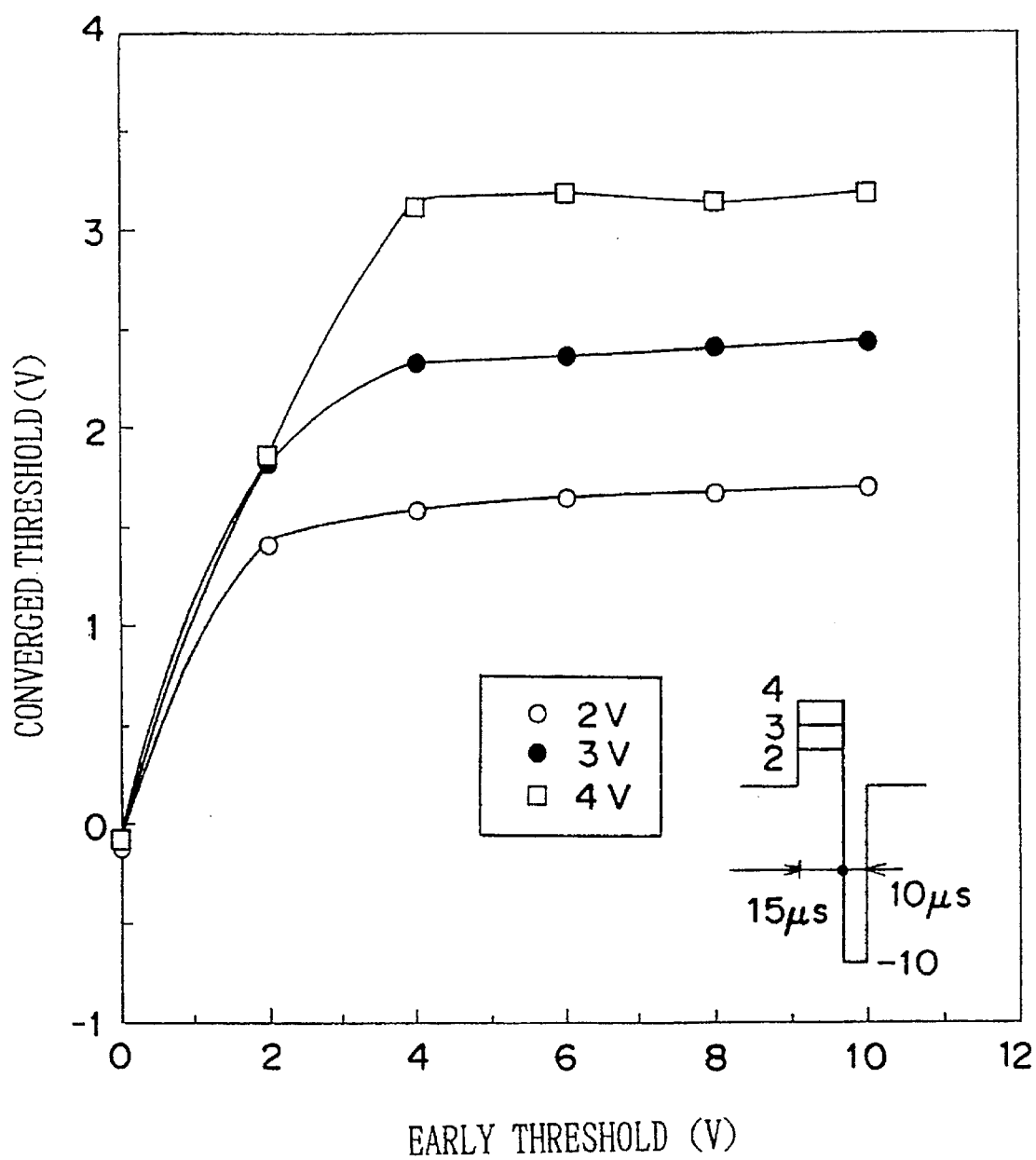
FIG. 8 is a block diagram showing a fourth embodiment of a memory device of the invention.
Figure 9:
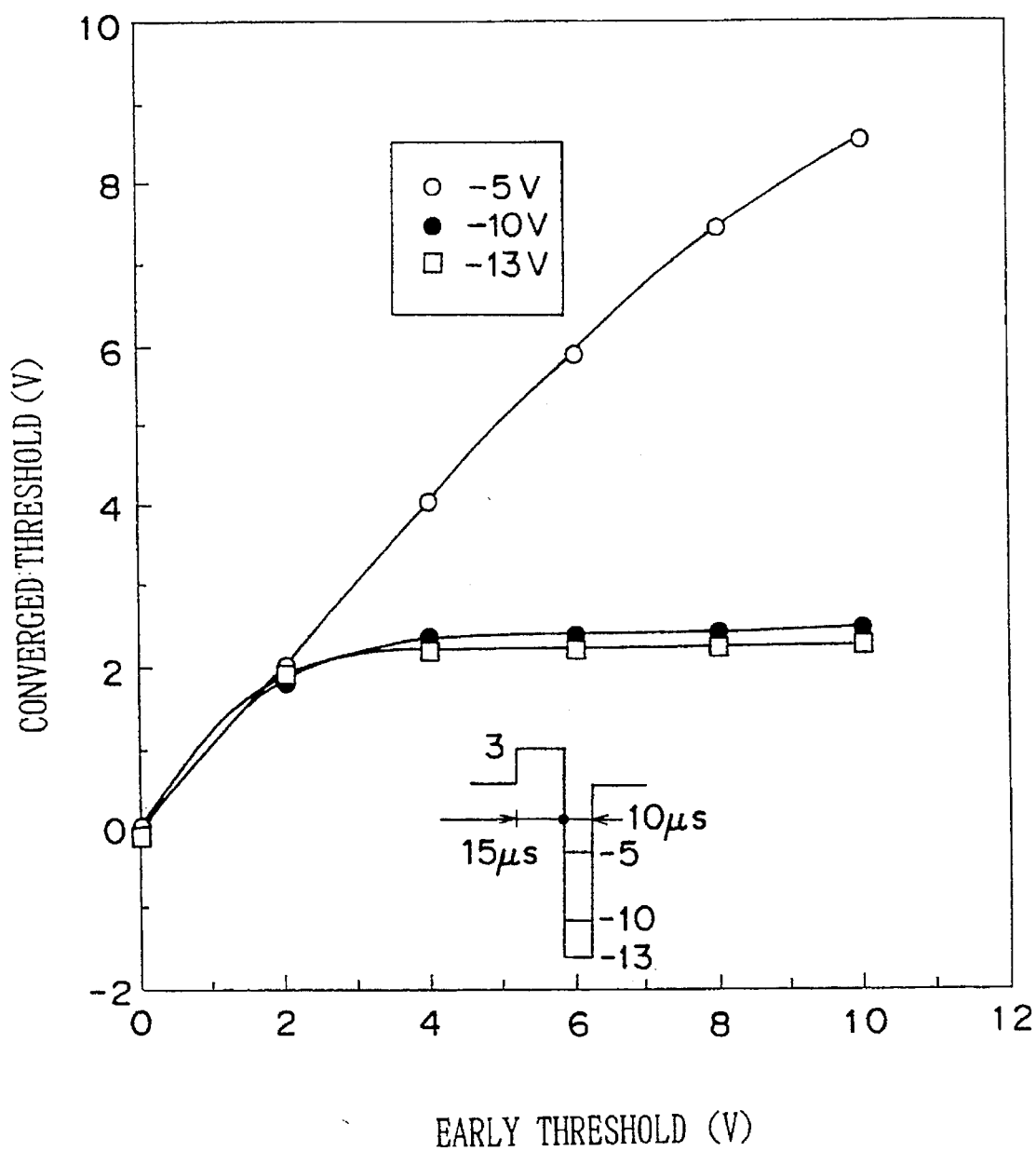
FIG. 9 also shows a relation between early thresholds of non-volatile memory cells and threshold after alignment.
Figure 10:
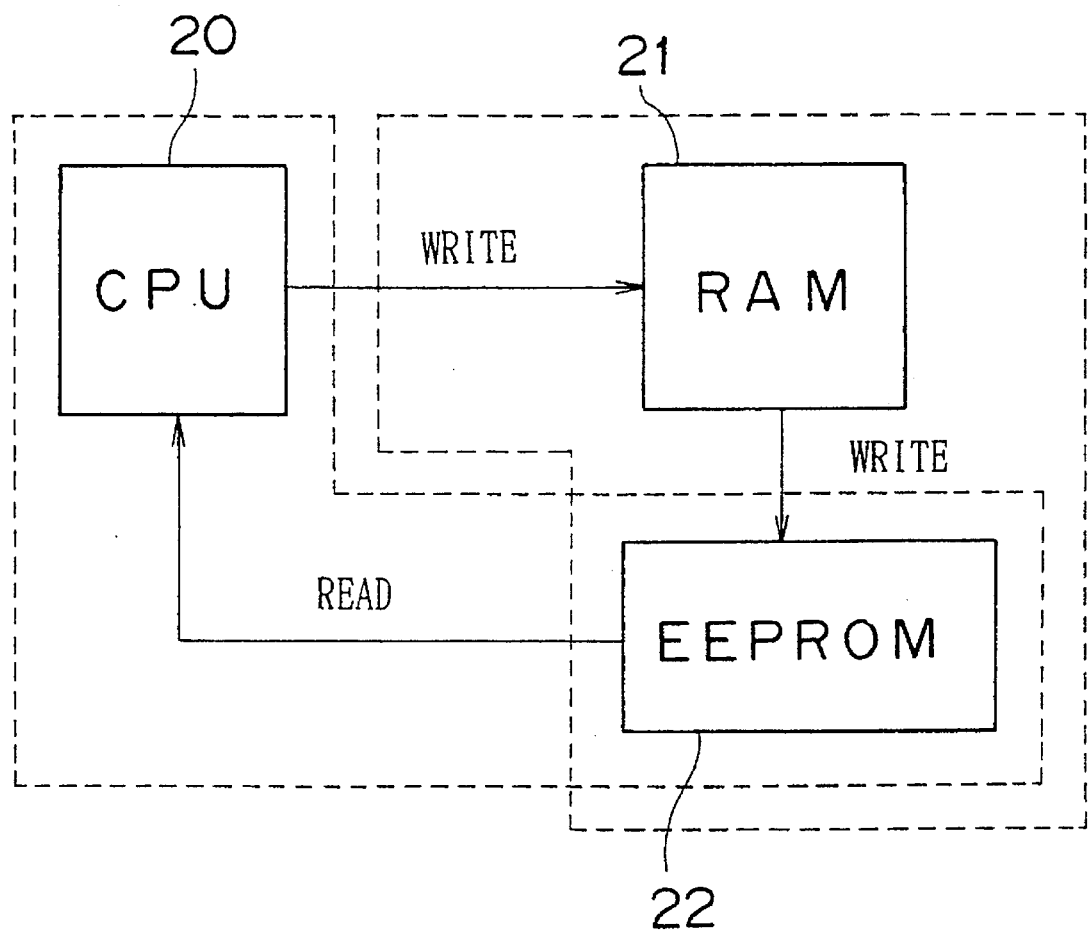
FIG. 10 is a block diagram illustrating prior art write and read operations.
Figure 12A:
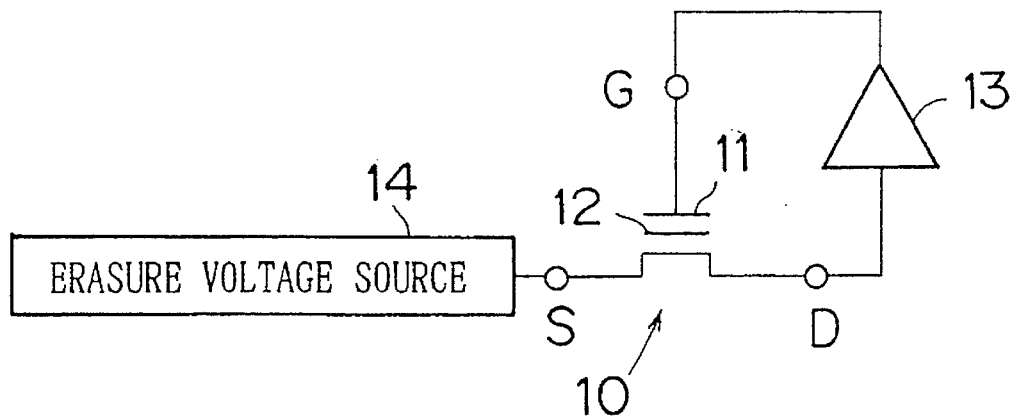
FIG. 12A is a circuit diagram illustrating a prior art method of aligning threshold values.
Figure 12B:
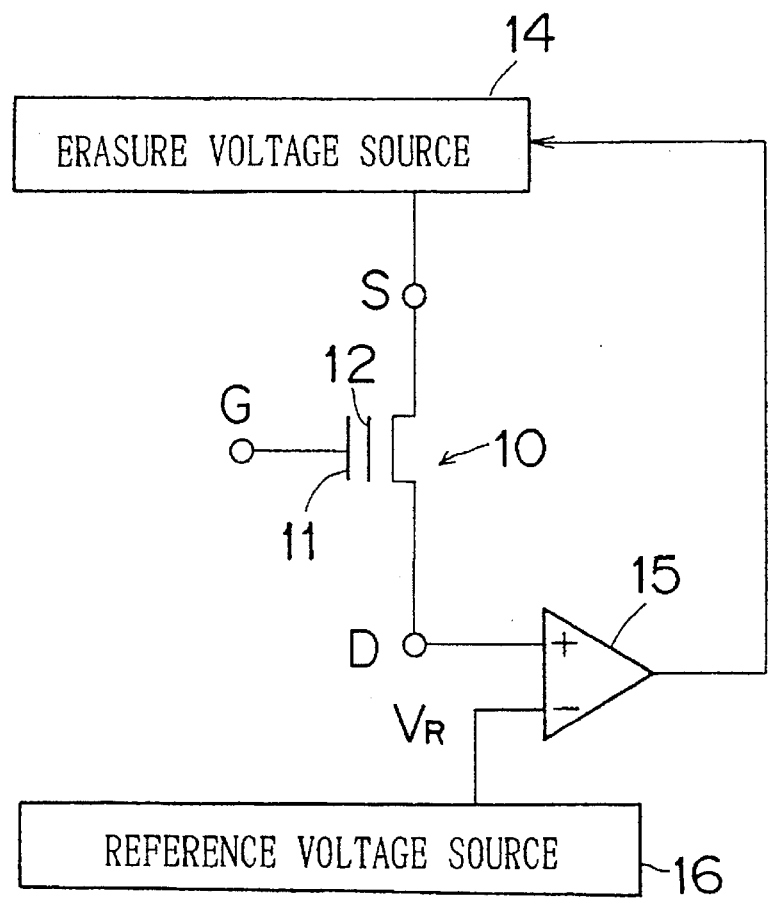
FIG. 12B is a circuit diagram illustrating another prior art method of aligning threshold values.

FIGS. 8 and 9 illustrate the aforementioned advantages more clearly. In the figures, the abscissa represents early threshold voltages of memory cells and the ordinate shows threshold voltages converged by applying an a–c voltage that includes ten pulses to the control gate.

FIG. 8 illustrates a converged distribution of threshold values achieved by applying a rectangular waveform, which includes positive pulses having a peak value of 4V, 3V, or 2V with a pulse width of 15 μs and a peak value of −10V with a pulse width of 10 μs, to the gate electrode of the memory transistor. FIG. 9 illustrates a converged distribution of thresholds resulted from an application of a rectangular waveform, which includes positive pulses having a peak value of 3V with a pulse width 15 μs and negative pulses having a peak value of −13V, −10V, and −5V with a pulse width of 10 μs to the gate electrode of the memory transistor.

As is clear form FIGS. 8 and 9, converged values or ranges of threshold may be predicted based on at least early threshold values and a–c voltages applied to the control gate. From FIGS. 8 and 9, the followings are revealed.

(1) When early threshold values are greater than 4V, the threshold values converge at substantially the same value irrespective of the early values.

(2) When the positive peak voltage applied to the control gate is higher than the early threshold values of memory cells, the threshold values converge at substantially the same value irrespective of the early values.

(3) When the negative peak voltage of an a–c voltage applied to the control gate is less than −10V, the threshold values converge at substantially the same value irrespective of the early values.

In the aforementioned alignment method where higher voltage and lower voltage pulses are used, pulses of lower voltages cause the threshold value of the memory cell to decrease while pulses of higher voltages enable verification and discrimination of thresholds of the memory cell. The pulses of higher voltages correspond to positive pulses and the pulses of lower voltages correspond to negative voltages, if an a–c voltage having positive and negative swings is used.

The threshold values of the memory cells may be converged to a desired target value by selecting an appropriate value of higher voltage of a pulse train applied to the control gate. The shorter the application time of the lower voltage of a pulse train applied to the control gate, the smaller becomes the value of the tunnel current flowing during the application of the pulse. In other words, when a smaller amount of electron is extracted each time from the floating gate, the threshold value of the memory cells converge at a certain value more closely. On the other hand, a short application time of the lower voltage of a pulse train applied to the control gate, fails to cause the drain voltage of the memory transistor to sufficiently decrease before the next lower voltage is applied, being difficult to properly control the convergence of threshold value of the memory cell. This indicates that the higher voltage should be applied to the control gate for a longer time than the lower voltage unless the operational speed of the non-volatile memory device is significantly affected.

When an a–c voltage having positive and negative swings is used, the absolute value of the positive voltage is preferably smaller than that of the negative voltage. Although the electric field distribution within the gate oxide contributes to some extent, it is assumed that injection of electron into the floating gate occurs when negative voltages are applied, as easily as extraction of electron from the floating gate occurs when positive voltages are applied to the control gate. If the absolute value of the positive voltage is greater than that of the negative voltage, electrons are sometimes injected into the floating gate more than electrons are extracted from the floating gate with the result that the threshold value of the memory cell increases.

The injection of electron into the floating gate due to application of positive voltages may be ignored under some conditions. The aforementioned method of aligning threshold value is practically performed without difficulty if an application of a positive voltage is less effective in changing threshold value of the memory cell than an application of a negative voltage.

The lower voltage of a pulse train applied to the control gate is preferably sufficiently lower than the drain voltage of the memory transistor. Extraction of electron from the floating gate is performed by applying a lower voltage. Extraction of electron becomes more difficult as the drain voltage gradually decreases while an a–c voltage is being applied. Therefore, it is important that the lower voltage to be applied to the control gate is set sufficiently lower than the drain voltage of the memory transistor so as to facilitate extraction of electron i.e., a flow of tunnel current. The amplitude of the lower voltage applied to the control gate preferably varies in accordance with the drain voltage.

With the method mentioned above, it is preferable that the higher voltage be applied to the control gate of the memory transistor before the lower voltage is applied. This is due to the fact that if the memory cell is an EEPROM, an application of a negative voltage prior to a positive voltage causes a relatively low threshold of the memory cell to further decrease, resulting in excessive erasure of the memory cell. This causes a short-circuit from source electrode to drain electrode, so that drain voltage cannot be applied, data cannot be read, and bit lines cannot be charged.

However, an application of a lower voltage prior to an application of a higher voltage causes no problem. For example, a lower voltage of about −1V rather than −10V may not cause excessive erasure in many cases though it depends on the early threshold value of the memory cell. Thus, a voltage of about −1 volt does not cause any problem if it is applied to the control gate before a higher voltage is applied. It is to be noted that when −1 volt is applied and then +3 volts, a low voltage of about −10 volts should be applied subsequently. That is, applying a sufficiently low negative voltage relative to the drain voltage of the memory transistor facilitates a flow of tunnel current.

The aforementioned method of aligning threshold values is novel not only in that the threshold values of floating gate type non-volatile memory cells are varied so as to urge threshold values to converge within a certain range, but also in erasing data from or writing data into the floating gate type non-volatile memory cells. Thus, this method is referred to as a–c pulse method in the embodiment.

Another embodiment of a non-volatile memory device according to the invention will be described with reference to the schematic diagram in FIG. 2. The non-volatile memory cell in the above embodiment as well as in the following embodiments is a well known floating gate type non-volatile memory cell.

The non-volatile memory cell includes a semiconductor substrate on which a source/drain diffusion layer is formed, a gate oxide or tunnel oxide formed on the main surface of the semiconductor substrate, and a floating gate formed of a conductive layer surrounded by the gate oxide and insulator, a control gate positioned on the floating gate with the insulator sandwiched therebetween. The tunnel oxide is of about 100 angstroms thickness. The floating gate formed of a conductive polysilicon layer is covered with an insulator such as tunnel oxide and ONO (stacked layer of silicon-silicon nitride-silicon oxide). The control gate is formed on the ONO. The floating gate is of a dimension of 3 µm×1 µm and is arranged to sandwich the gate oxide together with channel and a part of source/drain diffusion layer. The channel size is 1 µm×1 µm. Of course, a floating gate type non-volatile memory cell is not limited to this dimension.

FIG. 2A shows known floating gate type non-volatile memory cells M1-Mn. A main bit line BL1 is connected to a sense amplifier 2 as well as to a sub bit line BLs1 via a selector transistor Tr1. The drains of non-volatile memory cells M1-Mn are connected with the sub bit line BLs1 and the sources are connected together to a ground line G. A gate selecting line ST1 is connected with the gate of the selector transistor Tr1 and word lines W1-Wn are connected with the control gates of the non-volatile memory cells M1-Mn, respectively.

A unit memory element 1 is formed of the main bit line BL1, sub bit line BLs1 connected to the main bit line via the selector transistor Tr1, and non-volatile memory cells M1-Mn connected to the sub bit line BLs1. A plurality of such memory cells are regularly arranged to form the essential part of a non-volatile memory device.

Figure 2B:
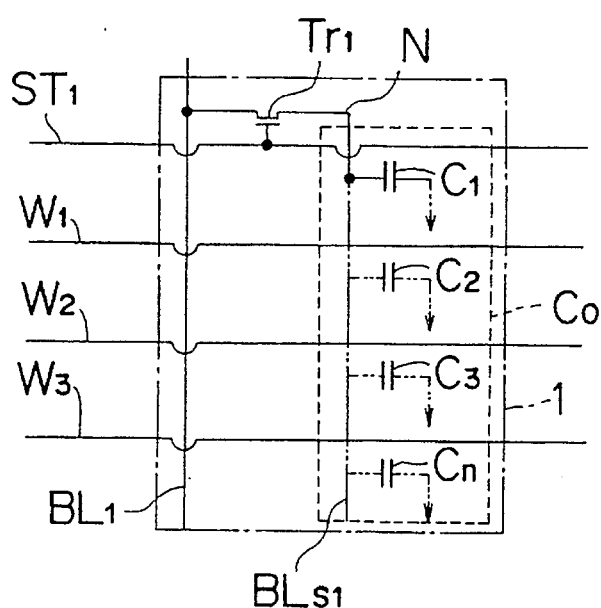
FIG. 2B is an equivalent circuit of a basic unit in FIG. 2A.

FIG. 2B shows an equivalent circuit of a unit memory 1 based on the parasitic capacitance of the sub bit line BLs1 and portions electrically connected to the sub bit line BLs1. The non-volatile memory cells M1-Mn have equivalent capacitors formed of parasitic capacitance C1-Cn, respectively, and these parasitic capacitance are in parallel and connected with the source of the selector transistor Tr1. The resultant entire equivalent capacitor is of capacitance Co. The equivalent circuit in FIG. 2C also applies to the circuit in FIG. 2B. That is, the gate selecting line ST1 and bit line BL1 in FIG. 2B correspond to the word line W' and main bit line BL' in FIG. 2C, respectively. The selector transistor Tr1 and the capacitor element Co form a DRAM cell. Thus, the DRAM cell may operate just as in conventional DRAMs, so that data is written, erased, read, and refreshed independently of the non-volatile memory cells M1-Mn.

Figure 2D:
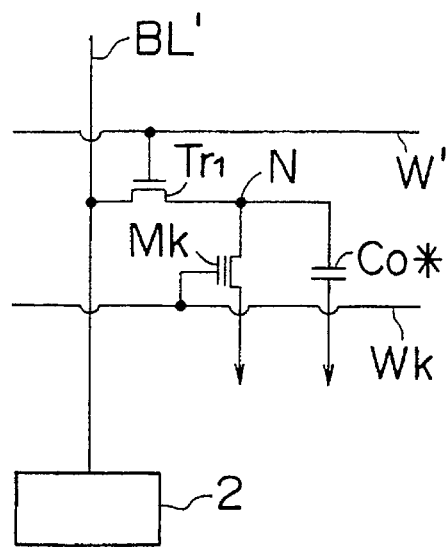
FIG. 2D shows still another equivalent circuit of the basic unit in FIG. 2A.

Moreover, the equivalent circuit in FIG. 2B is equivalent to that in FIG. 2D. That is, the word line Wn and bit line BL1 correspond to the word line Wk and bit line BL' in FIG. 2D, respectively. The structure of the DRAM cell in FIG. 2D is similar to that in FIG. 2C. The circuit in FIG. 2D is in fact a combination type non-volatile memory cell where a non-volatile memory cell Mk is connected to the memory node N of the DRAM cell. A special feature is that the selector transistor Tr1 is not only an element of the DRAM but also an element of the non-volatile memory cell Mk if the non-volatile memory cell Mk is an EEPROM. As is clear from equivalent circuits in FIGS. 2C and 2D, the basic units i in FIGS. 2A and 2B may be regarded as a memory element. Thus, there are as many DRAM cells or combination type non-volatile memory cells as there are basic units incorporated in the non-volatile memory device.

The aforementioned DRAM type memory element operates the same way as a conventional DRAM cell. Writing data or erasing data is performed by first specifying the address in terms of row (BL') and column (W') of a DRAM cell into which data is written or from which data is erased. Then, the selector transistor Tr1 is turned on, so that data of a logic level 1 or 0 s stored onto the capacitor element Co via the bit line BL'. Reading data is performed by first addressing the memory cell from which data is to be read. Then, the bit line BL' is set to a potential intermediate between the high threshold value and the low threshold value of the DRAM cell, the high threshold value implying that data has been stored while the low threshold value indicating that no data has been stored. Then, the selector transistor Tr1 is turned on to connect the memory node N with the bit line BL' with the result that the voltage on the bit line BL' changes. The change in voltage of bit line BL' is detected with a voltage detecting type sense amplifier 2, thereby reading data.

Data refreshing is performed by first addressing the memory cell to be refreshed. Then, data stored in the memory cell is detected in terms of the change in voltage of the bit line BL' with the sense amplifier 2, and the voltage is subsequently amplified to full swings of either logic level 1 or 0.

The aforementioned combination type non-volatile memory cell includes a DRAM cell formed of a selector transistor Tr1 and a capacitor element Co*, and a non-volatile memory cell Mk. The respective cells operate the same way as conventional DRAM cells and non-volatile memory cells. That is, writing, erasing, reading, and refreshing data are performed the same was as a DRAM type memory element.

Writing, erasing, and reading operations of the floating gate type non-volatile memory cell may be described with respect to a conventional floating gate type non-volatile memory. The operation of a floating gate type non-volatile memory cell of a stack type will be described with reference to FIG. 2D in terms of the change in threshold of a memory cell due to injection of electron into the floating gate and extraction of electron from the floating gate.

It is defined in the instant specification for convenience sake that write operation corresponds to injection of electron into the floating gate and erase operation corresponds to extraction of electron from the floating gate. However, it is only a matter of definition choice which operation corresponds to injection of electron or extraction of electron.

(1) A method of aligning the threshold value of a memory cell to a higher value.

After addressing the memory cell Mk to be aligned for a higher threshold, the bit line BL' and the gate selecting wire W' of the selector transistor Tr1 are applied with a potential higher than the supply voltage. At the same time, the control gate, i.e., word line Wk of the memory cell Mk is applied with a potential higher than the supply voltage. For example, if the supply voltage is 5 volts, the bit line BL' is set to 7 volts, the gate selecting wire W' is set to 7 volts, and the word line Wk is set to 6 volts. Upon applying the high potentials, a high electric field is developed in the direction from the floating gate of the memory cell Mk to the drain electrode, so that electrons are injected into the floating gate to set the threshold value of the memory cell MR to a high value, i.e., data logic 0.

(2) A method of aligning the threshold value of memory to a lower value.

After addressing the memory cell MR to be aligned for a lower threshold, the bit line BL' and the gate selecting wire W' of the selector transistor Tr1 are applied with a potential of about the supply voltage. In addition, the control gate of the memory cell Mk is applied with a negative voltage. For example, if the supply voltage is 5 volts, the bit line BL' is set to 5 volts, the gate selecting wire W' is set to 5 volts, and the word line Wk is set to −10 volts. Upon applying the high potentials, a high electric field is developed in the direction from the drain electrode of the memory cell Mk to the floating gate of the memory cell Mk, so that electrons are extracted from the floating gate to set the threshold value of the memory cell Mk to a lower value, i.e., data "1".

(3) A method of reading data in terms of high and low thresholds of the memory cell.

This method corresponds to a data reading method of reading data from a floating gate type non-volatile memory cell.

(A) Current method

After addressing the memory cell Mk to be aligned for a lower threshold, the gate of the selector transistor (gate selecting wire W') is applied with a potential of about the supply voltage to turn the selector transistor Tr1 on, The bit line BL' is applied with a relatively low positive voltage, i.e., a voltage just enough to prevent injection of electron in the form of hot electron into the floating gate. This voltage is about 1–2 volts for a supply voltage of 5 volts. Then, the control gate (word line WK) is applied with a voltage intermediate between a voltage indicative of data "0" and a voltage indicative of data "1". The memory cell Mk becomes on if the threshold value of the memory cell Mk corresponds to data "1", so that a channel current flows from the drain electrode of the memory cell to the source. The memory cell Mk does not turn on if the threshold value of the memory cell Mk corresponds to data "0", so that the channel current will not flow through the memory cell. A current detecting type sense amplifier 2 detects and outputs the channel current via the bit line BL', thereby reading data from the memory cell Mk.

(2) Voltage method

After addressing the memory cell Mk to be aligned for a lower threshold, the gate of the selector transistor (gate selecting wire W') is applied with a potential of about the supply voltage e.g., 5 volts to turn the selector transistor Tr1 on. A precharge circuit, not shown, charges the bit line BL' to set the drain electrode of the memory cell Mk to a positive potential, e.g., 5 volts. Then, the selector transistor is turned off to disconnect the memory cell Mk from the bit line BL'. The precharge circuit, not shown, supplies a voltage of about half (e.g., 2.5 volts) the supply voltage to the bit line BL'. Then, a voltage intermediate between a voltage indicative of data "0" and a voltage indicative of "1," is applied to the control gate (word line Wk) of the memory cell Mk. The memory cell Mk becomes on if the threshold of the memory cell Mk is of data "1", so that the potential of the drain electrode of the memory cell Mk decreases. The memory cell Mk remains off if the threshold value of the memory cell Mk corresponds to data "0" so that the potential of the drain electrode will not decrease. Then, the word line Wk is grounded and a voltage of about the supply voltage is supplied to the gate of the selector transistor Tr1 to turn on the selector transistor Tr1, so that the drain electrode of the memory cell Mk is connected to the bit line BL' so as to change the potential of the bit line BL'. The change in potential of the bit line BL' is detected with the voltage detecting type sense amplifier 2 to read data.

(3) Other method

After addressing the memory cell Mk to be aligned, a precharge circuit, not shown, charges the bit line BL' to a voltage of about half the supply voltage, e.g., 5 volts. Then, the gate (gate selecting wire W') of the selector transistor Tr1 is applied with a voltage of about the supply voltage, e.g., 5 volts to turn the selector transistor Tr1 on. Then, the selector transistor is turned off to disconnect the drain electrode of the memory cell Mk from the bit line BL'. Then, a voltage intermediate between a voltage indicative of data "0" and a voltage indicative of data "1," is applied to the control gate (word line Wk) of the memory cell Mk. The memory cell Mk turns on if the threshold of the memory cell Mk corresponds to data "1", so that the potential of the drain electrode of the memory cell Mk decreases. The memory cell Mk remains off if the threshold value of the memory cell Mk corresponds to data "0," so that the potential of the drain electrode will not decrease. Thereafter, just as in the previously mentioned voltage method of (2), the word line Wk is grounded and a voltage of about the supply voltage, e.g., 5 volts is supplied to the gate of the selector transistor Tr1 to turn on the selector transistor Tr1, so that the drain electrode of the memory cell Mk is connected to the bit line BL' so as to change the potential on the bit line BL'. The voltage detecting type sense amplifier 2 detects the change in potential of the bit line BL', thereby reading data.

As mentioned above, a combination type non-volatile memory cell according to the invention has a floating gate type non-volatile memory, so that data may be read out of the floating gate type non-volatile memory cell through the use of the current method. However, the sense amplifier for use in the current method is of a current detecting type. On the other hand, it is a voltage detecting type sense amplifier that is used to read data from the DRAM cell of the combination type non-volatile memory cell and to refresh the data. Therefore, if the current method is to be used to read data from a floating gate type non-volatile memory cell, the combination type non-volatile memory cell of the invention requires two different sense amplifiers. This is not economical. It is preferable that the voltage method is also used to read data from the floating gate type non-volatile memory cell so that the same sense amplifier may be commonly used for reading data from the DRAM and the floating gate type non-volatile memory cell.

The operation of a combination type non-volatile memory cell of the invention where two different cells are combined, will be described as follows:

Writing, erasing, reading, and refreshing operations of DRAM cells are enabled by grounding the word line Wk to render the floating gate type non-volatile memory cell Mk nonconductive. Thus, the DRAM cells may be used as a temporary storage means.

Data is transferred from the DRAM cell to the floating gate type non-volatile memory cell in the following manner. When the capacitor element Co* has been charged up, data may be transferred in one of the following two manners.

(A) When the threshold value of the memory cell Mk is low, there is no need for data transfer.

(B) If the threshold value of the memory cell Mk is high, the selector transistor Tr1 is turned on to apply a negative voltage to the word line Wk, or the a–c pulse method is used to align the threshold value for a lower value. The memory cell Mk is turned on so that a channel current flows, thus charges being discharged from the capacitor element Co* via the drain electrode to the memory cell Mk. In this manner, a data is transferred which corresponds to the charged condition of the capacitor element Co* and the low threshold value of the memory cell Mk.

Data is not transferred in the following two cases when he capacitor element Co* has not been charged.

(C) Data may not be transferred if the memory cell Mk has a low threshold value.

(D) Data need not be transferred if the memory cell Mk has a high threshold value.

Data is transferred from the floating gate type non-volatile memory cell to the DRAM cell in the following manner. The word line Wk is grounded to render the memory cell non-conductive. Subsequently, a high voltage is applied to the bit line BL' while at the same time the selector transistor Tr1 is turned on, thus charging the capacitor element Co* Then, the selector transistor Tr1 is turned off and the control gate of the memory cell Mk is applied with an voltage intermediate between the high threshold value of the memory cell Mk and the low threshold value. If the memory cell Mk has a high threshold value, channel current will not flow. If the threshold value is low, channel current flows to discharge the charges on the capacitor element. In this case, data is transferred so that the potential on the capacitor element Co* reflects the threshold of the memory cell Mk.

The time chart in FIG. 3 shows how the refreshing operation and the a–c pulse method are conveniently applied to a combination type non-volatile memory cell of the invention shown in FIG. 2.

The DRAM cell of the combination type non-volatile memory cell suffers from deterioration of data due to leakage of charge. Thus, data refreshing is performed as mentioned previously. That is, after addressing the memory cell Mk to be refreshed, the bit line BL' is applied with an intermediate voltage between a high threshold of the DRAM cell corresponding to the presence of data and a low threshold corresponding to the absence of data. Then, the word line W' (gate selecting line ST1) is set to a high level to turn on the selector transistor Tr1 as shown in FIG. 3B, so that the memory node N and the bit line BL' are connected together, causing the potential on the bit line BL' to change. The change in potential of the bit line BL' is detected with the voltage detecting type sense amplifier 2 to subsequently amplify the potential of the bit line BL' to a full high level or a low level, thus refreshing the data as shown in FIG. 3A.

An a–c voltage is applied to the control gate (word line Wk) of the memory cell Mk in order to apply the a–c pulse method when transferring data and to align the threshold value of a floating gate type non-volatile memory cell Mk. In this case, it is important that the selector transistor Tr1 is turned off and the capacitor element Co* is sufficiently charged so that the drain voltage of the memory cell MK is sufficiently high. However, applying an a–c voltage having a finite number of pulses with a certain period of pulse, causes the charges to leak from the capacitor element Co* during the application of pulses with time, losing advantages of the a–c pulse method. To overcome this problem, a pulse train is applied to the control gate one pulse at a time during refreshing operation, i.e., the charge-holding period of the capacitor element Co*, so that the application of the finite number of a–c voltages to the control gate is completed while performing a plurality of refreshing operations as shown in FIG. 3C. For example, when an a–c voltage having six pulses is to be applied to the control gate, the first pulse is applied after the first refreshing operation, and the second pulse after the second refreshing operation, and so on. This enables the a–c pulse method to be performed always with a sufficiently high drain voltage of the memory cell Mk, allowing proper and smooth alignment of threshold of the memory cell MR i.e., uniform convergence of thresholds toward a desired value, erasure of data or write operation of data, and transferring of data from the DRAM to the memory cell Mk.

The number of pulses applied to the control gate of the memory cell Mk during refreshing operation is not limited to one, and more than one pulse having a narrower pulse width may be applied. If the refreshing operation and the application of an a–c voltage to the control gate overlap each other with respect to time, electrons are extracted from the floating gate of the memory cell Mk before the drain voltage of the memory cell Mk becomes sufficiently high, resulting in large variations of threshold value. Thus, as is apparent from a comparing FIG. 3B with FIG. 3C, a pulse signal is applied to the word line Wk only when the word line W' is low and the selector transistor Tr1 is off.

A combination type non-volatile memory cell sometimes suffers from a drawback that a sub bit line may not be held at a high potential for a sufficiently long time due to leakage current from the capacitor element Co* if the sub bit line is formed of a diffusion layer. In this case, a pulse train having a narrower pulse width e.g., 5 μm and fewer number of pulses e.g., 3 periods may be applied to the word line Wk while also performing refreshing operation of the capacitor element Co* alternately with the a–c pulse method. Refreshing may be performed an arbitrary number of times. Fifty times may be sufficient.

Other embodiment of a non-volatile memory device according to the invention will be described with reference to FIGS. 4A–48.

Figure 4A:
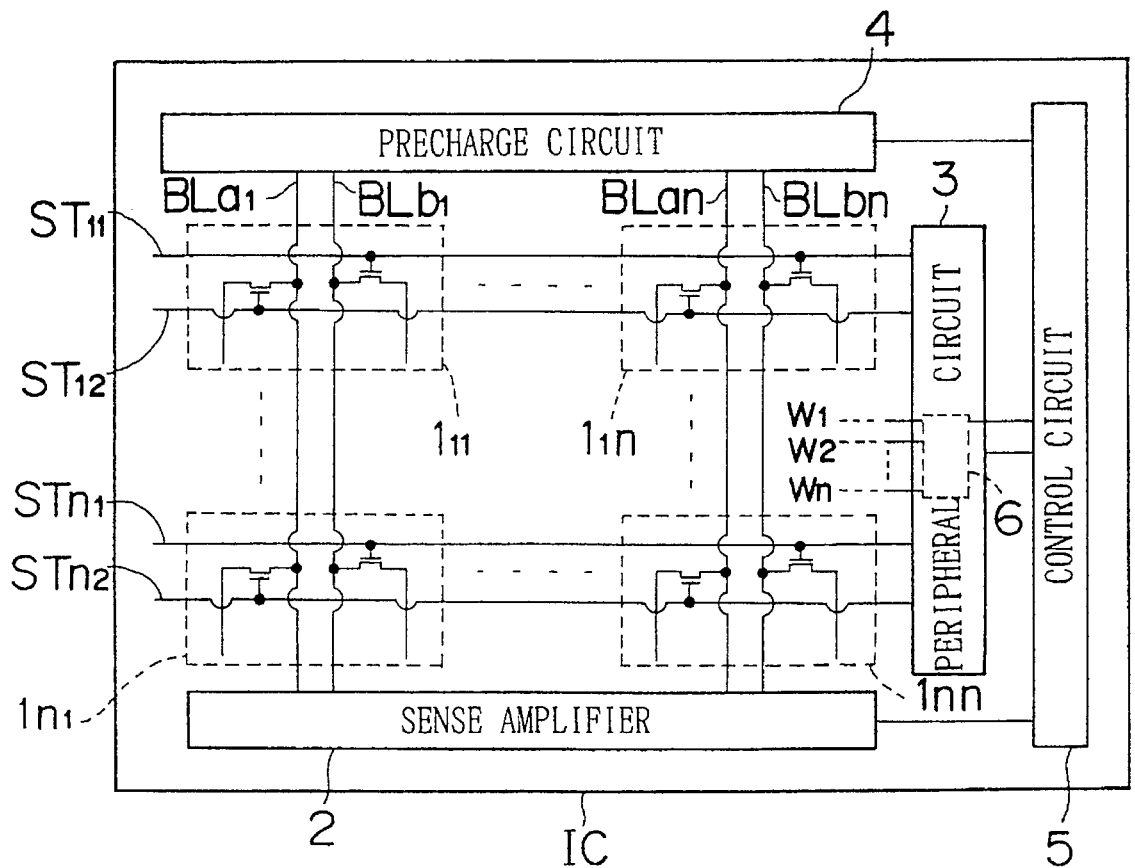
FIG. 4B is the schematic diagram of basic units.
Figure 4B:
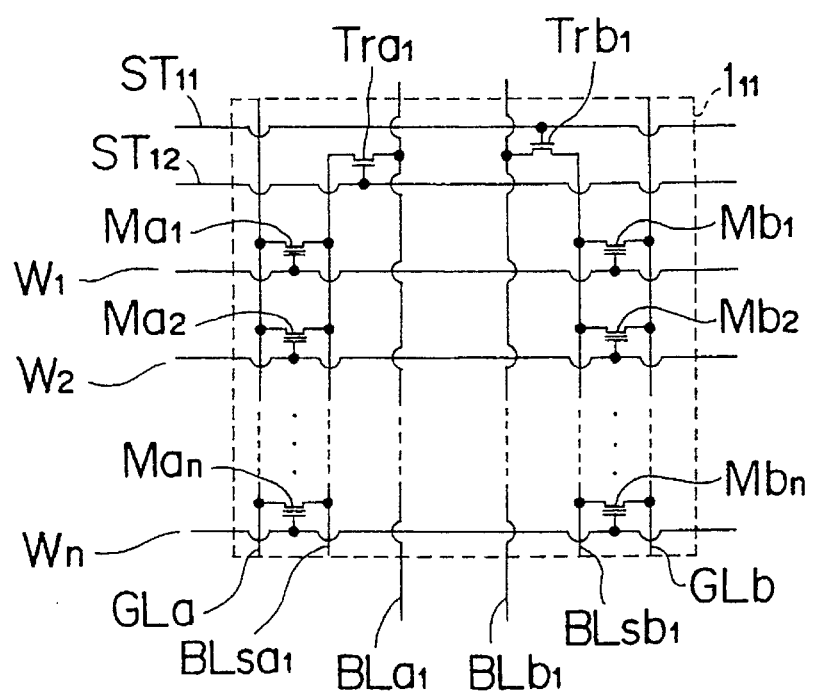

FIG. 4A shows the essential part of the non-volatile memory device. In FIG. 4A, basic units $1_{11}$-$1_{nn}$ are shown in simplified form and are arranged in matrix form to provide a memory array. Gate selecting lines are depicted by ST11-Stn1 and ST12-STn2. The gate selecting lines "St11 and ST12," "ST21 and ST22," ..., "STn1 and STn2" and word lines W11, W2, ..., Wn are common throughout basic units "$1_{11}, 1_{12} ..., 1_{1n}$," "$1_{21}, ..., 1_{2n}$," "$1_{n1}, 1_{n2}, ..., 1_{nn}$," respectively, Main bit lines are depicted by BLa1-BLan and BLb1-BLbn. Reference numeral 2 denotes a sense amplifier and numeral 3 denotes a peripheral circuit where a decoder, an address buffer, and other circuits are integrated. Reference numeral 4 denotes a precharge circuit and numeral 5 a control circuit. An ac pulse signal generator 6 is incorporated in the peripheral circuit.

Main bit lines BLa1-BLan and BLb1-BLbn are connected with the precharge circuit 4 and the sense amplifier 2. The gate selecting lines ST11-STr1 and ST12-STn2 are connected to the peripheral circuit 3. The word lines W1-Wn are connected with the a–c pulse signal generator 6. Reference IC denotes an integrated circuit that includes the aforementioned array, sense amplifier 2, peripheral circuit 3, and precharge circuit 4. The control circuit 5 controls the operations of the sense amplifier 2, peripheral circuit 3, a–c pulse signal generator 6 in the peripheral circuit 3, and precharge circuit 4 and more specifically, writing, erasing, reading, refreshing operations of data, applying the a–c pulse method, and transferring the data within a combination type non-volatile memory cell. The control circuit 5 may be a plurality of physically separate circuits, each performing different function. The control circuit 5 may be either integrated on the IC or provided outside of the IC. Operating conditions of the a-14 c pulse signal generator 6, such as the shape, period, amplitude, width, and the number of pulses may be adjusted. Such adjustment may be performed from outside of the IC or by the control circuit 6. The operating conditions of the a–c pulse may be fixed beforehand.

The basic unit $1_{11}$ forming a memory array in FIG. 4A, includes two parts as shown in FIG. 48. A first part includes the main bit line BLa1, sub bit line BLsa1, selector transistor Tra1 connected with the main bit line BLa1 to select the sub bit line BLsa1, and non-volatile memory cell 5 Ma1-Man connected in parallel with the sub bit line BLsa1. A second part includes the main bit line BLb1, sub bit line BLsb1, selector transistor Trb1 connected with the main bit line BLb1 to select the sub bit line BLsb1, and non-volatile memory cells Mb1-Mbn connected in parallel with the sub bit line BLb1. The sources of the non-volatile memory cells Ma1-Man and Mb1-Mbn are connected to the ground lines GLa and GLb, respectively. Of the non-volatile memory cells, the control gates of Ma1 and Mb1, Me2 and Mb2 ..., Man and Mbn are connected with the word lines W1, W2 ..., Wn. The word lines W1-Wn are supplied with an a–c voltage outputted from the a–c pulse signal generator 6 for applying the a–c pulse method. The gates of the selector transistors Tra1 and Trb1 are connected with the gate selecting lines ST12 and ST11. The precharge circuit 4 in this embodiment charges the selected sub bit lines BLsa1-BLsan and BLsb1-BLsbn via the main bit lines BLa1-BLan and BLb1-BLbn, respectively.

Figure 5A:
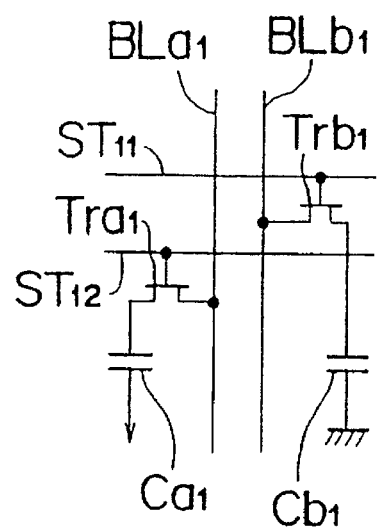
FIG. 5A is an equivalent circuit of a basic unit in FIG. 4B.

FIG. 5A is an equivalent circuit of the basic unit $1_{11}$. As is apparent from a comparing FIG. 5B with FIG. 2B, the gate selecting line ST12 and ST11 may be regarded as the word line W', so that the basic unit $1_{11}$ is a new memory cell including a pair of DRAM cells i.e., a first DRAM cell constructed of a capacitor Ca1 and a selector transistor Tra1 and a second DRAM cell constructed of a capacitor Cb1 and a selector transistor Trb1. This indicates that the non-volatile memory device shown in FIG. 4A may be operated as an independent DRAM device.

Figure 5B:
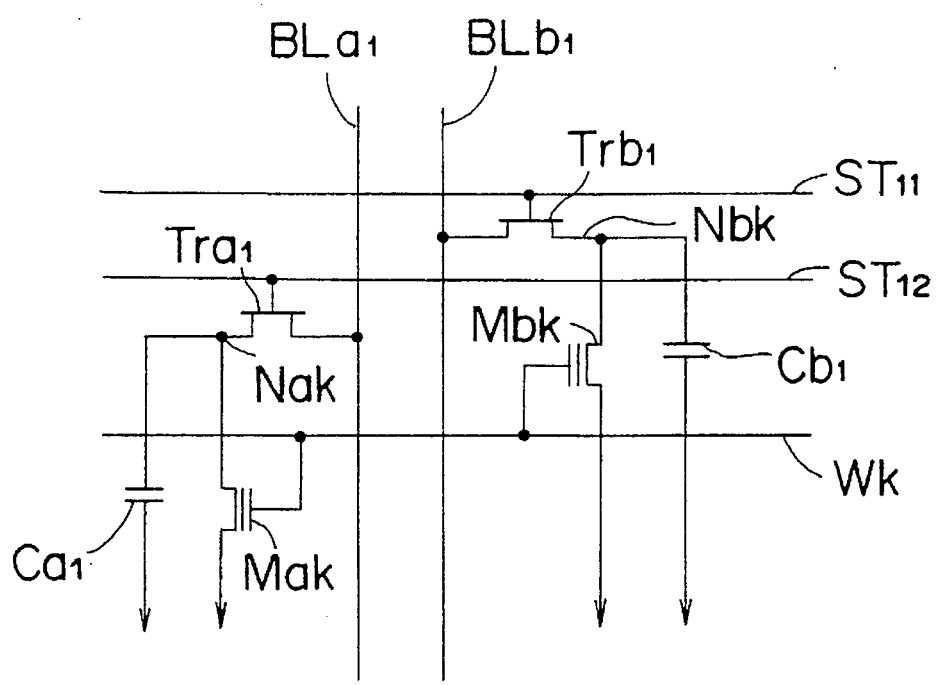
FIG. 5B shows another equivalent circuit of the basic unit in FIG. 4B.

FIG. 5B is another equivalent circuit of the basic unit $1_{11}$. As is apparent from a comparing FIG. 58 with FIG. 2D, the gate selecting line ST12 and ST11 may be regarded as a word line W', so that the basic unit $1_{11}$ is a novel memory cell including a first combination type non-volatile memory cell which has a memory element formed of a transistor Tra1 and a capacitor Ca1, and a second combination type non-volatile memory cell constructed of a capacitor Cb1, a selector transistor Trb1, and a floating gate type non-volatile memory cell Mbk electrically connected with a memory node Nbk of the memory element. This indicates that the non-volatile memory device shown in FIG. 4A may be operated as a non-volatile memory device incorporating DRAM functions. Thus, use is made of the DRAM functions in temporarily storing data to be written into the non-volatile memory cell, so that the device operates as a small, simple memory device which allows faster writing operation. The DRAM capacitor elements residing in the device may be used in applying the a–c pulse method, allowing simple and general alignment of threshold of memory cells and very rapid write (or erase) operation. It is to be noted that the memory cells Nak and Mbk in the basic unit 1kj (j=1, 2, 3, ..., n) are aligned threshold values thereof toward the same desired value through the use of the a–c pulse method. This ensures high speed and reliable operation of the non-volatile memory device.

Figure 6:
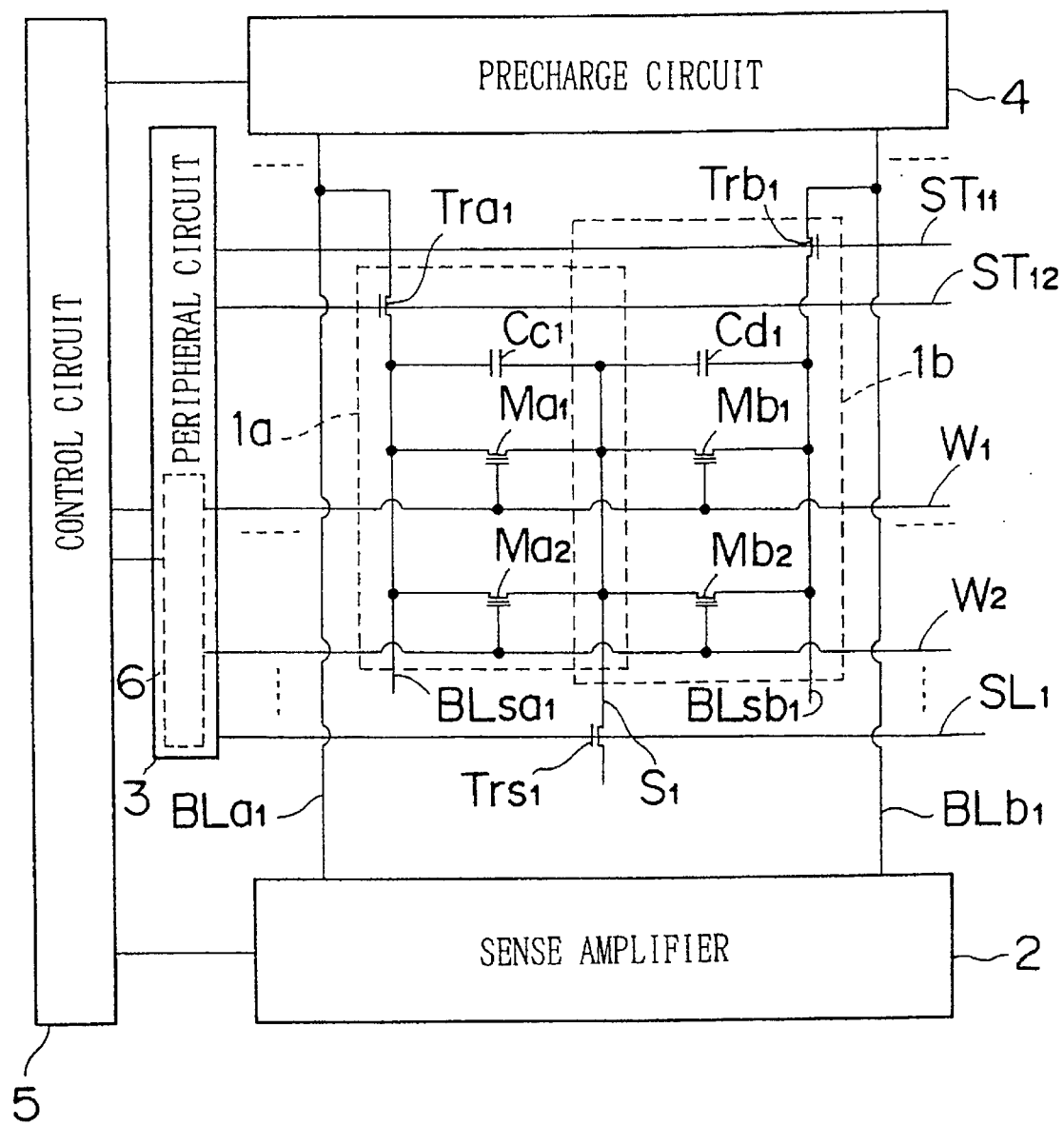

Other embodiment of a non-volatile memory device of the invention will be described with reference to FIG. 6. In FIG. 6, elements having the same references as those in FIG. 4 perform the same functions and description thereof are omitted.

FIG. 6 shows two adjacent basic units 1a and 1b. A plurality of such basic units are regularly arranged to form the entire non-volatile memory device. The basic unit has a selector transistor Tra1, a sub bit line BLsa1 connected with a main bit line BLa1 via the selector transistor, memory cells Ma1, Ma2, ..., connected in parallel with the sub bit line BLsa1, and a capacitor element Cc1. The basic unit 1b has a selector transistor Trb1, and sub bit line BLsb1 connected with a main bit line BLb1 via the selector transistor Trb1, non-volatile memory cells Mb1, Mb2, ..., connected in parallel with the sub bit line BLsb1, and a capacitor element Cd1. The two basic units have in common a source line S1 connected to a source supply voltage, not shown, via the selector transistor Trs1. In other words, the sources of the non-volatile memory cells Ma1, Ma2, ... and Mb1, Mb2, ... and the capacitor elements Cc1 and Cd1 are connected with the common source line S1. Of the non-volatile memory cells, the control gates of and Mb1 and Ma2 and Mb2, ... are connected to the common word lines W1, W2, ... respectively. The a–c pulse generator 6 supplies an a–c voltage to the word line W2, ... for performing the a–c voltage method. The main bit lines BLa1 and BLb1 are electrically connected with the sense amplifier 2 and the precharge circuit 4. The gate selecting lines ST11 and ST11 connected with the selector transistors Tra1 and Trb1 may be used in common with adjacent basic units. For example, in FIG. 6, the selector transistor Tra1 may be used in common with another basic unit, not shown, on the left hand side of the basic unit 1a, and the selector transistor Trb1 may be used in common with another basic unit, not shown, on the right hand side of the basic unit 1b. Furthermore, the gate selecting lines ST11 and ST12 may be used in common. That is, a plurality of selector transistors having gates connected in common may be controlled as a unitary construction. A source selecting line SL1 is connected with the gate of the selector transistor Trs1, and serves to connect the source via the selector transistor Trs1 to the ground or virtual ground.

The precharge circuit 4 of the embodiment charges the selected sub bit lines BLsa1-BLsan and BLsb1-BLsbn via the main bit lines BLa1-BLan and BLb1-BLbn, respectively. The control circuit 5 controls the operations of the sense amplifier 2, peripheral circuit 3, a-c pulse signal generator 6 in the peripheral circuit, and precharge circuit 4, and more specifically, writing, erasing, reading, and refreshing operations of data or applying the a-c pulse method and transferring data within a combination type non-volatile memory cell.

As is apparent from FIG. 6, the basic units 1a and 1b differ from those in FIGS. 4C and 5B in that the ground terminal of the capacitor element and the source electrodes of a floating gate type non-volatile memory are connected with a common source line S1. The basic units 1a and 1b are novel units including a DRAM type memory element in FIG. 4C and a combination type non-volatile memory cell in FIG. 5B. Thus, the non-volatile memory device in FIG. 6 may be operated as an independent DRAM. Further, the non-volatile memory device in FIG. 6 may be operated as a non-volatile memory having DRAM functions. Use is made of the DRAM functions in temporarily storing data to be written into the non-volatile memory, so that the non-volatile memory device as of simple construction and small size and has shorter write time. The memory device has advantages similar to those of the embodiment in FIG. 4A where existing DRAM capacitor elements are directly used when applying the a-c pulse method.

The embodiment in FIG. 6 is characterized in that the capacitor elements Cc1 and Cd1 are added as a part of the capacitor elements Ca1 and Cb1. This embodiment is advantageous when the parasitic capacitances of the selector transistors Tra1 and Trb and the sub bit lines BLsa1 and BLsb1 are small. In particular, parasitic capacitance of wires and portions electrically connected with the wires become smaller as circuit density increases, so that the bit lines are not sufficiently precharged. This is detrimental in aligning threshold value. Insufficient precharge of the bit lines due to small parasitic capacitance Co makes data reading and refreshing operations difficult. In such cases, capacitors Cc1 and Cd1 should be added. Likewise, capacitors Ca1 and Cb1 are added to supplement the precharge voltage of the bit lines in FIGS. 5A and 5B.

The values of Co and Co* must satisfy the following conditions (1) and (2) if the a-c pulse method is to be effective.

(1) The capacitance of the floating gate of one non-volatile memory <<the capacitance between the sub bit line and the source line.

(2) The time constant that determines the leakage current and the capacitance of the sub bit line in a floating state >>pulse width applied to the word line.

In addition, when the a-c pulse method is applied, i.e., the control gate of the memory transistor is applied with an a-c voltage, the voltage drop of the bit line while the a-c voltage is applied is preferably within ±5%.

As a rule of thumb, Co and Co* that satisfy the conditions (1) and (2) are in the rage of 100–300 fF. Therefore, where the parasitic capacitance of the bit line and portions electrically connected to the bit line is larger than 100–300 fF, the auxiliary capacitor elements C1 and C2 may not be required.

Writing and erasing operations in the a-c pulse method will be described with respect to the embodiment in FIG. 6.

The operations will be described when a non-volatile memory cell Ma1 having a threshold higher than 7 volts. Establishing an electric field such that electron is injected into the floating gate, enables to set thresholds high. For example, a voltage of 8 volts is applied to the control gate of the memory transistor of the non-volatile memory cell Ma1, zero volt to the source, and 6 volts to the drain so as to allow a channel current to flow between the source electrode and the drain electrode. The channel current causes hot electrons to be injected into the floating gate. Thus, the threshold value increases. Similarly, the memory cells Me2, Mb1, and Mb2 may be set to high thresholds.

The sub bit lines BLsa1 and BLsa2 are set to 5 volts and ground, respectively, and the source line S1 to ground. Then, the selector transistor Tra1 is turned on to bring the sub bit line BLsa1 into floating condition, allowing to charge the capacitor element Ca1, which is the entire the capacitance of the capacitor element formed of parasitic capacitance of the sub bit line BLsa1 and the drain region of non-volatile memory cells Ma1, Ma2, . . . connected with the sub bit line BLsa1 and the additional capacitor element Cc1. A pulse train having swings between 5 volts and −10 volts as shown in FIG. 7C is applied to the word line W1 i.e., the control gate of the non-volatile memory cell Ma1 with the word line W2 connected to the ground.

The pulse signal has positive and negative voltages in the order of 5V with a pulse width of 20 Ks, −10V with a pulse width of 10 μs, 5V with a pulse width of 20 μs and so on. Each application of a negative pulse, i.e., −10 volts to the control gate of the non-volatile memory cell Ma1 causes a tunnel current to flow between the floating gate and the drain so that channel current flows between the source and the drain upon the threshold value has been converged to a desired value. The channel current causes the drain voltage of the memory cell, i.e., the voltage on the sub bit line BLsa1 to decrease to a level corresponding to a desired threshold value so that the tunnel current will cease to flow between the floating gate and the drain. Thus, the threshold value of the non-volatile memory cell Ma1 becomes low while the threshold value of the non-volatile memory cell Mb1 remains high. A low threshold value indicates a condition where data has been written or erased. Tunnel current will not flow through the other non-volatile memory cell Ma2 since the sub bit line BLsa2 is at the ground level. Tunnel current will not flow between the floating gates and the drain electrodes of the non-volatile memory cells Mb1 and Mb2 since the word line W2 is at the ground level and the potential of the floating gate will not change. Thus, data may be written into or erased from the non-volatile memory cell Ma1 only. Applying the same procedure to the other non-volatile memory cells Ma2, Mb1, Mb1, . . . permits to write data into and erase data from a desired memory cell.

The operations will be described when a non-volatile memory cell Ma1 has a threshold as low as 2 volts.

Just as in the case where a threshold value is high, the sub bit lines BLsa1 and BLsb1 are set to 5 volts and ground, respectively, and the source line S1 to the ground. Then, the selector transistor Tra1 is turned on to bring the sub bit line BLsa1 into floating condition, allowing to charge the resultant capacitor element Ca1. Then, a pulse train having swings between 4 volts and −10 volts is applied and the word line W1. The pulse signal has positive and negative voltages in the order of 4V with a pulse width of 20 μs, −10V with a pulse width of 10 μs, 4V with a pulse width of 20 μs, −10V with a pulse width of 10 μs and so on. If an initial voltage applied to the non-volatile memory cell Ma1 is a positive voltage, e.g., 4 volts, the positive voltage causes channel current to flow between the source electrode and the drain electrode so that the drain voltage will significantly decrease and subsequent application of negative voltage, i.e, −10 volts will not cause tunnel current to flow between the floating gate and the drain electrode. First applying a positive voltage will prevent excess extraction of charge from the floating gate of the non-volatile memory cell having a low threshold value, preventing excessive erasure of data.

No tunnel current will flow through the other non-volatile memory cells Ma2, Mb1, and Mb2, . . . The use of the a–c method enables simple and versatile data erasure from non-volatile memory cells, eliminating the complex prior art method that writing is performed prior to erasure to align the threshold values. The a–c pulse method usually requires a capacitor element for holding the drain electrode at a high level. A combination type non-volatile memory cell and a memory device incorporating the combination type non-volatile memory cell according to the invention utilizes wire capacitances existing within the memory cells as a capacitor element. This is a great advantage in that direct application of the a–c method is possible without necessitating complex construction of memory device.

The operation of a memory device including combination type non-volatile memory cells will be described as follows:

The following description assumes that an arbitrary basic unit $1_{ij}$ (i=1, 2, ... m;=1, 2, 3, , , , m n) is a combination type non-volatile memory cell that includes a capacitor Co*kij of a DRAM cell and a floating gate non-volatile memory cell MKij, where k=1, 2, . . . , 1. The basic units $1_{i1}, 1_{2j}, \ldots, 1_{nj}$ have the bit line BLj in common and the basic units $1_{ij}, 1_{i2}, \ldots, 1_{in}$ have the word line Wi in common. The respective steps of operation of the non-volatile memory device have already been mentioned.

The basic unit 1ij is in an initial condition where Co*kij has been discharged and the memory cell Mkij has a high threshold value. The memory cell Mkij may be set to a high threshold value by first aligning the threshold value of Mkij to a low value by the a–c pulse method to subsequently inject electrons into the floating gate of Mkij. This operation may be simultaneously performed to cells i.e., Mkij, Mk2j, . . . , Mkmj connected to the common word line Wi.

Data is first written onto Co*kij from outside. If Co*kij is charged up as a result of data writing operation, the data is transferred to the memory cell Mij by the a–c pulse method so as to set the threshold of Mij to a low value. If Co*(k+1)ij is charged up, the threshold of Mkij may remain high. Then, data is written onto Co*kij from outside. When Co*(k+1)ij is charged up as a result of writing operation, the data is transferred to the memory cell M(k+1)ij by the a–c pulse method so as to set the threshold of M(k+1)ij to a low value. When Co*(k+1)ij is charged up, the threshold of M(k+1)ij may remain high.

The aforementioned steps are repeated for the basic unit 1ij so as to write data into one cell (M1ij, M2ij, . . . , M1ij). In this manner, data to be ultimately written into the cell Mkij is temporarily stored on the capacitor element Co*kij and is then transferred to the cell Mkij, thus implementing high speed write operation. The aforementioned data-writing operation is performed simultaneously on a bit-by-bit basis both to a group of n basic units $(1_{1i}, 1_{2i}, \ldots, 1_{nj})$ connected with a common bit line and to a group of m basic units $(1_{i1}, 1_{i2}, \ldots, 1_{im})$ connected with a word line common to the group of n basic units, further speeding up writing operation. Data erasing operation to the DRAM cells or the floating gate type non-volatile memory cells may be performed simultaneously to a group of m basic units $(1_{1i}, 1_{2i}, \ldots, 1_{im})$ connected with a common word line. The data erasing operation of the floating gate type non-volatile memory cells is performed by the a–c method, being simple, fast, easy-to-control, and highly accurate.

Of course, the construction of bits of an non-volatile memory device according to the invention is not limited to the aforementioned embodiment and many other configurations may be possible just as in conventional DRAMs. A typical configuration includes folded bit lines and precharge bit lines.

Advantages of the Invention

The present invention provides a novel DRAM type memory element whose capacitor element is formed of parasitic capacitance existing on the wire or wires and portions electrically connected with the wire or wires. This novel DRAM type memory element is combined with a floating gate type non-volatile memory cell to provide a novel combination type non-volatile memory cell.

The DRAM type memory element incorporated in the non-volatile memory device may function independently of the inherent functions of the non-volatile memory device. Thus, the floating gate type non-volatile memory cell and the DRAM cell in a combination type non-volatile memory cell may operate independently of each other. This allows the DRAM cell to temporarily store data and to subsequently transfer the data to the floating gate type memory cell, so that a large amount of data may be transferred to the non-volatile memory cells in a short time saving overall write time. The DRAM is fabricated as a temporary storage element within the non-volatile memory device, simplifying and miniaturizing peripheral circuits.

The combination type non-volatile memory cells and the non-volatile memory device incorporating the combination type memory cells according to the invention, are based on parasitic capacitance which serves as a capacitor element existing in the combination type non-volatile memory cells as well as in the non-volatile memory device itself, so that the a–c method may be applied to the capacitor element. Thus, the a–c pulse method may be directly applied without making the memory device complex.

Additionally, the threshold voltage may be controlled simultaneously with high accuracy in a simple manner, significantly saving erasure time or write time and providing reliable operation of a non-volatile memory device. Applying a refreshing operation for refreshing the data temporarily stored on the capacitor element alternately with applying the a–c pulse method to the floating gate type non-volatile memory cells permits accurate alignment of threshold by the a–c pulse method and smooth data transfer.

What is claimed is:

1. A storage element comprising a transistor and a capacitor formed of parasitic capacitance wherein said parasitic capacitance exists in an electrically conductive line electrically connected with said transistor.

2. A memory cell comprising:

a storage element including a transistor and a capacitor which is coupled thereto at a node and formed of parasitic capacitance existing in an electrically conductive line electrically connected with said transistor; and a non-volatile memory cell electrically connected with said storage element at said node and having a control and a floating gate.

3. A memory cell according to claim 2, wherein said parasitic capacitance includes parasitic capacitance existing in one or more portions electrically connected with said electrically conductive line.

4. A memory device comprising:

a non-volatile memory cell having a transistor with a control gate and a floating gate;

a bit line to which said non-volatile memory cell is connected;

a selector switch element for selecting said bit line; and a capacitor element formed of parasitic capacitance of said bit line.

5. A memory device according to claim 4, wherein said device further includes a means for applying a voltage varying between a first potential and a second potential to said control gate.

6. A memory device according to claim 5, wherein a plurality of said non-volatile memory cells are connected with said bit line.

7. A memory device according to claim 5, wherein said device includes a means setting either one of the source and drain of said transistor in a floating state at a potential higher than the potential of the other before applying said voltage varying between a first potential and a second potential to said control gate and wherein an initial threshold of said non-volatile memory cell is greater than 4 volts.

8. A memory device according to claim 4, wherein said capacitor element includes a capacitor connected with said bit line in parallel with said non-volatile memory cell.

9. A memory device comprising:

a main bit line:

a non-volatile memory cell having a transistor with a control gate and a floating gate;

a sub bit line to which said non-volatile memory cell is connected;

a selector switch element for connecting said main bit line with said sub bit line;

a storage element including said selector switch element and a capacitor element formed of parasitic capacitance of said sub bit line; and a transfer means for transferring data stored in said storage element to said non-volatile memory cell.

10. A memory device according to claim 9, wherein said device includes a refresh means for refreshing data stored in said capacitor element.

11. A memory device according to claim 10, wherein said device includes a control means for activating said transfer means alternatively with said refresh means.

12. A method of storing information using a memory cell having a transistor and an electrically conductive line electrically connected therewith, comprising the step of:

storing dam in a capacitor element formed of parasitic capacitances of said electrically conductive line.

13. A method of storing information using a memory cell having a transistor and an electrically conductive line electrically connected therewith, comprising the steps of:

storing data in a capacitor element formed of parasitic capacitance of said electrically conductive line; and transferring said data to said memory cell.

14. A method of storing information using a non-volatile memory cell having a transistor with a control gate and a floating gate, and a bit line to which said non-volatile memory cell is connected, wherein said method includes thee steps of:

applying a voltage varying between a first potential and a second potential to said control gate; and erasing data stored in a capacitor element formed of parasitic capacitance of said bit line.

15. A method of storing information according to claim 14, wherein said voltage varying between a first potential and a second potential is an a-c voltage and wherein an early threshold of a non-volatile memory cell is greater than a positive peak voltage of said a-c voltage.

16. A method of storing information according to claim 14, wherein said voltage varying between a first potential and a second potential is an a-c voltage and wherein a negative peak voltage of said a-c voltage is smaller than −10 volts.

17. A method of storing information based on a non-volatile memory cell having a transistor with a control gate and a floating gate, a bit line to which said non-volatile memory cell is connected, and a selector switch for selecting said bit line, comprising the steps of:

refreshing data stored in a capacitor element formed of parasitic capacitance of said bit line; and transferring said data to said non-volatile memory cell and being performed alternatively with said step of refreshing data stored in said capacitor element without overlapping each other with respect to time.

18. The storage element according to claim 1, wherein said electrically conductive line is a bitline of a random access memory device.

19. The storage element according to claim 18, wherein said random access memory device is a static random access memory device.

20. A storage element according to claim 1, wherein said parasitic capacitance includes parasitic capacitance existing in one or more portions electrically connected with said electrically conductive line.

21. A method of storing information according to claim 14, wherein said method further includes a step of setting either one of the source and drain of said transistor in a floating state at a potential higher than the potential of the other before applying said voltage varying between a first potential and a second potential to said control gate.

22. A memory device according to claim 4, wherein said parasitic capacitance includes parasitic capacitance existing in one or more portions electrically connected with said electrically conductive line.

23. A memory device according to claim 9, wherein said parasitic capacitance includes parasitic capacitance existing in one or more portions electrically connected with said electrically conductive line.

24. A method of storing information according to claim 12, wherein said parasitic capacitance includes parasitic capacitance existing in one or more portions electrically connected with said electrically conductive line.

25. A method of storing information according to claim 13, wherein said parasitic capacitance includes parasitic capacitance existing in one or more portions electrically connected with said electrically conductive line.

26. A method of storing information according to claim 14, wherein said parasitic capacitance includes parasitic capacitance existing in one or more portions electrically connected with said electrically conductive line.

27. A method of storing information according to claim 17, wherein said parasitic capacitance includes parasitic capacitance existing in one or more portions electrically connected with said electrically conductive line.

* * * * *